(12) United States Patent  (10) Patent No.: US 8,990,483 B2
Kwak  (45) Date of Patent:  Mar. 24, 2015

(54) NONVOLATILE MEMORY DEVICE, MEMORY SYSTEM, AND PROGRAM METHOD THEROF

(71) Applicant: DongHun Kwak, Hwaseong-si (KR)

(72) Inventor: DongHun Kwak, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 298 days.

(21) Appl. No.: 13/685,772

(22) Filed: Nov. 27, 2012

(65) Prior Publication Data

US 2013/0262751 A1 Oct. 3, 2013

(30) Foreign Application Priority Data

Apr. 3, 2012 (KR) ........................ 10-2012-0034496

(51) Int. Cl.
*G06F 12/00* (2006.01)
*G06F 13/00* (2006.01)
*G06F 13/28* (2006.01)
*G11C 11/34* (2006.01)
*G11C 16/04* (2006.01)
*G06F 12/02* (2006.01)
*G11C 16/34* (2006.01)
*G06F 11/07* (2006.01)
*H01L 27/115* (2006.01)

(52) U.S. Cl.
CPC ........ *G06F 12/0246* (2013.01); *G11C 16/3495* (2013.01); *G11C 16/349* (2013.01); *G06F 11/076* (2013.01); *G11C 16/3454* (2013.01); *H01L 27/11578* (2013.01); *G11C 16/0483* (2013.01)
USPC ........................ 711/103; 711/154; 365/185.11

(58) Field of Classification Search
CPC .............. G06F 12/0246; G06F 11/076; G06F 11/0793; G11C 16/0483; G11C 16/349; H01L 27/11578
USPC ............................... 711/103, 154; 365/185.11
See application file for complete search history.

(56) References Cited

U.S. PATENT DOCUMENTS

| 7,924,629 B2 | 4/2011 | Park et al. |
| 7,944,752 B2 | 5/2011 | Lee |
| 7,957,196 B2 | 6/2011 | Sarin et al. |
| 8,174,890 B2 | 5/2012 | Maeda et al. |
| 8,189,391 B2 | 5/2012 | Itagaki et al. |
| 2010/0214838 A1 | 8/2010 | Hishida et al. |
| 2010/0322000 A1 | 12/2010 | Shim et al. |
| 2011/0002173 A1 | 1/2011 | Nagamatsu et al. |
| 2011/0013458 A1 | 1/2011 | Seol |
| 2011/0199825 A1* | 8/2011 | Han et al. .................. 365/185.11 |
| 2011/0292724 A1* | 12/2011 | Kim ........................... 365/185.03 |
| 2012/0008394 A1* | 1/2012 | Lee et al. .................. 365/185.11 |
| 2012/0246395 A1* | 9/2012 | Cho et al. ....................... 711/103 |

FOREIGN PATENT DOCUMENTS

| JP | 2011-002178 | 1/2011 |
| JP | 2011-003264 | 1/2011 |
| JP | 2011-014205 | 1/2011 |

* cited by examiner

*Primary Examiner* — Ryan Bertram
(74) *Attorney, Agent, or Firm* — Renaissance IP Law Group LLP

(57) ABSTRACT

Disclosed is a method for programming a nonvolatile memory device, the nonvolatile memory device including cell strings formed in a direction perpendicular to a substrate, and which selects memory cells by a string selection line unit. The programming method includes detecting wear leveling information of a selected memory block, determining a selection sequence of string selection lines of the selected memory block according to the wear leveling information, and writing data at the selected memory block according to the determined selection sequence.

30 Claims, 29 Drawing Sheets

Fig. 8C
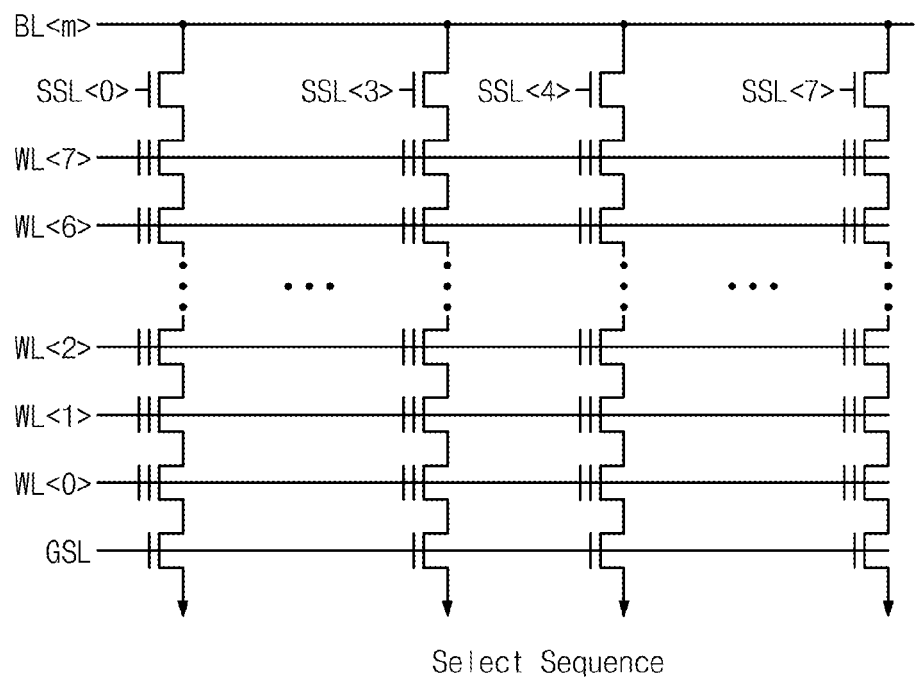
Select Sequence
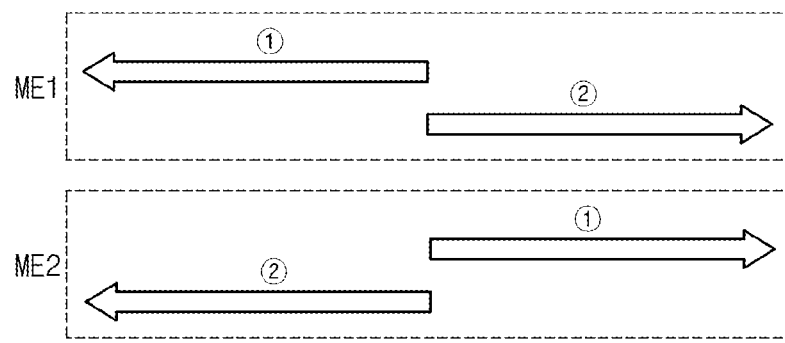

Fig. 8D
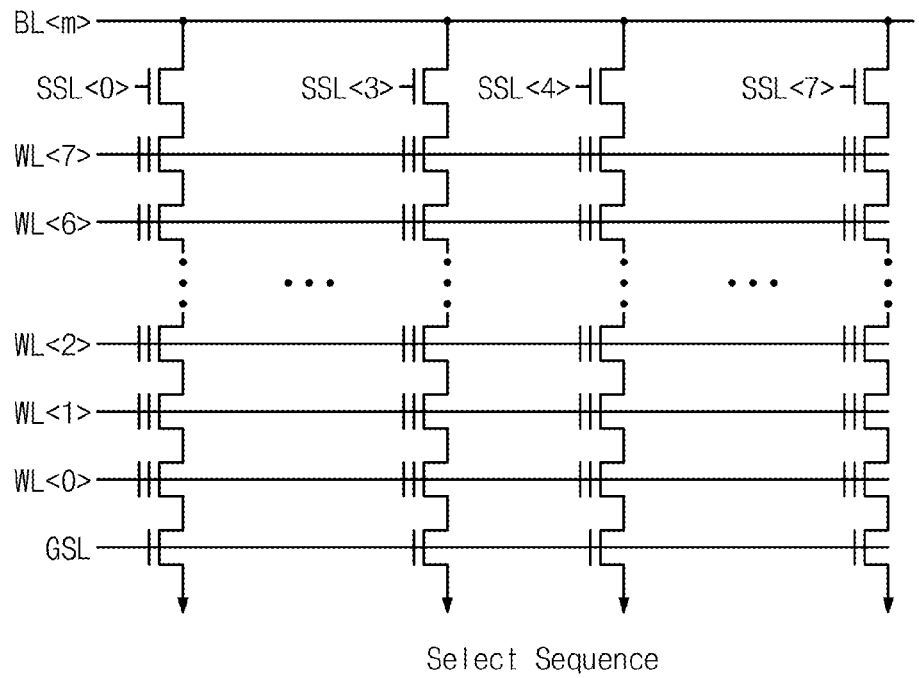
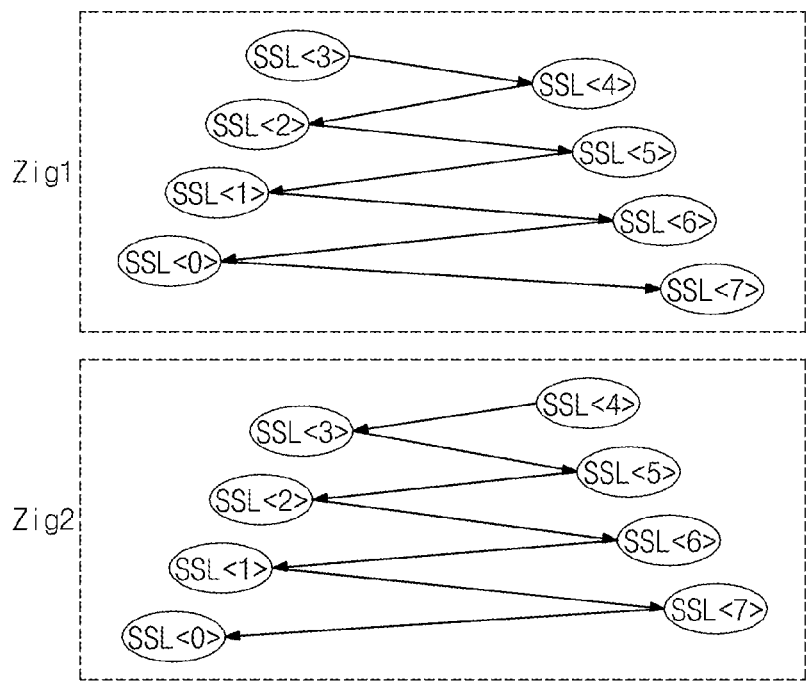

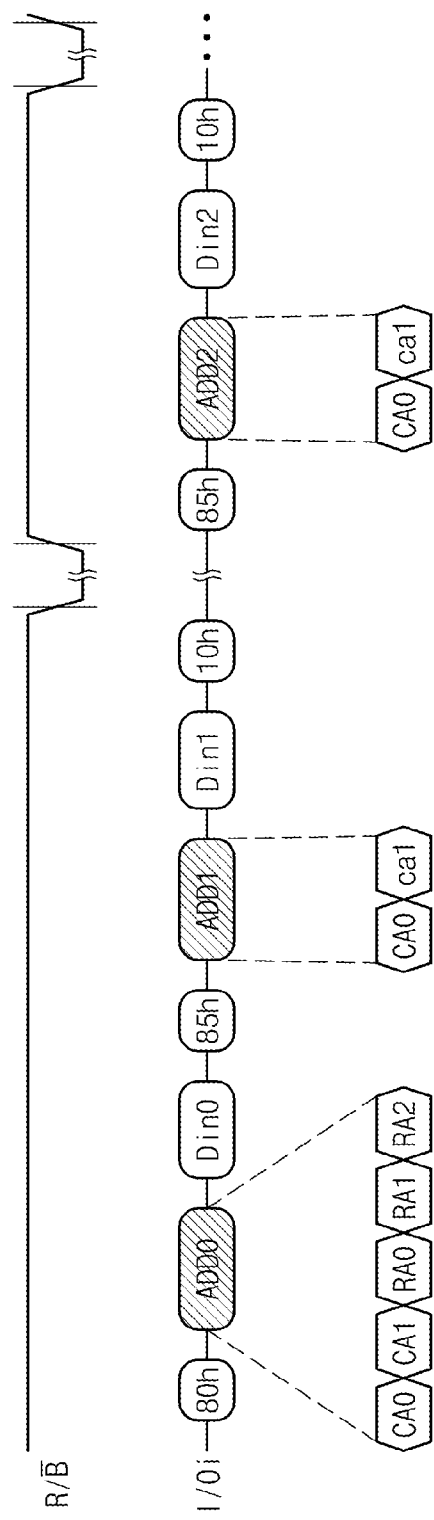

Fig. 14

| Input ADD \ WLCNT | 0 ≤ WLCNT<1K | 1K ≤ WLCNT<2K | 2K ≤ WLCNT |
|---|---|---|---|
| SSL<0> | SSL<0> | SSL<3> | SSL<7> |
| SSL<1> | SSL<1> | SSL<4> | SSL<6> |
| SSL<2> | SSL<2> | SSL<2> | SSL<5> |
| SSL<3> | SSL<3> | SSL<5> | SSL<4> |
| SSL<4> | SSL<4> | SSL<1> | SSL<3> |
| SSL<5> | SSL<5> | SSL<6> | SSL<2> |
| SSL<6> | SSL<6> | SSL<0> | SSL<1> |
| SSL<7> | SSL<7> | SSL<7> | SSL<0> |

ADD'

NONVOLATILE MEMORY DEVICE, MEMORY SYSTEM, AND PROGRAM METHOD THEROF

CROSS-REFERENCE TO RELATED APPLICATIONS

A claim for priority under 35 U.S.C. §119 is made to Korean Patent Application No. 10-2012-0034496 filed Apr. 3, 2012, in the Korean Intellectual Property Office, the entire contents of which are hereby incorporated by reference.

BACKGROUND

The inventive concepts described herein relate to a semiconductor memory device, and more particularly, relate to a nonvolatile memory device, a memory system, and a program method thereof.

Semiconductor memory devices may be volatile and nonvolatile. The volatile semiconductor memory devices may perform read and write operations at high speed, while contents stored therein may be lost at power-off. The nonvolatile semiconductor memory devices may retain contents stored therein even at power-off. The nonvolatile semiconductor memory devices may be used to store contents, which must be retained regardless of whether they are powered.

The nonvolatile semiconductor memory devices may include a mask read-only memory (MROM), a programmable ROM (PROM), an erasable programmable ROM (EPROM), an electrically erasable programmable ROM (EEPROM), and the like.

A flash memory device may represent a nonvolatile semiconductor memory device. The flash memory device may be widely used as a voice and image data storing medium for information appliances such as a computer, a cellular phone, a PDA, a digital camera, a camcorder, a voice recorder, an MP3 player, a handheld PC, a game machine, a facsimile, a scanner, a printer, and the like.

In recent years, a semiconductor memory device having memory cells stacked in three dimensions have been researched to improve the integrity of the semiconductor memory device.

SUMMARY

Example embodiments of the inventive concept provide a method for programming a nonvolatile memory device, the nonvolatile device including cell strings formed in a direction perpendicular to a substrate, the programming method comprising detecting wear leveling information of a selected memory block, determining a selection sequence of string selection lines of the selected memory block according to the wear leveling information, and writing data at the selected memory block according to the determined selection sequence.

Example embodiments of the inventive concept also provide a memory system, which comprises a nonvolatile memory device including a memory block connected with a plurality of string selection lines. The memory system may include a memory controller configured to control the nonvolatile memory device to select at least one of the plurality of string selection lines at a programming operation. A selection sequence of the plurality of string selection lines may be changed according to wear leveling information of the memory block.

Example embodiments of the inventive concept also provide a nonvolatile memory device comprising a cell array including a plurality of memory blocks each connected with a plurality of string selection lines. The nonvolatile memory device may include a page buffer connected with bit lines of the cell array, a decoder connected with the cell array via the plurality of string selection lines, and an address remapper configured to remap an input address according to wear leveling information to provide the remapped address to the decoder. The address remapper is configured to remap the input address such that a selection sequence of the plurality of string selection lines of a selected memory block is adjusted according to the wear leveling information.

BRIEF DESCRIPTION OF THE FIGURES

The above and other advantages and features will become apparent from the following description with reference to the following figures, wherein like reference numerals refer to like parts throughout the various figures unless otherwise specified, and wherein:

FIGS. 8A to 8D are diagrams illustrating selection sequences of string selection lines according to an embodiment of the inventive concept.

FIGS. 10A to 10H are timing diagrams illustrating a method of providing a write command and an address associated with a selected memory block from a memory controller.

FIG. 14 is a table describing an address adjusting operation of an address remapper of a nonvolatile memory device in FIGS. 12A and 12B.

DETAILED DESCRIPTION

Figure 1:
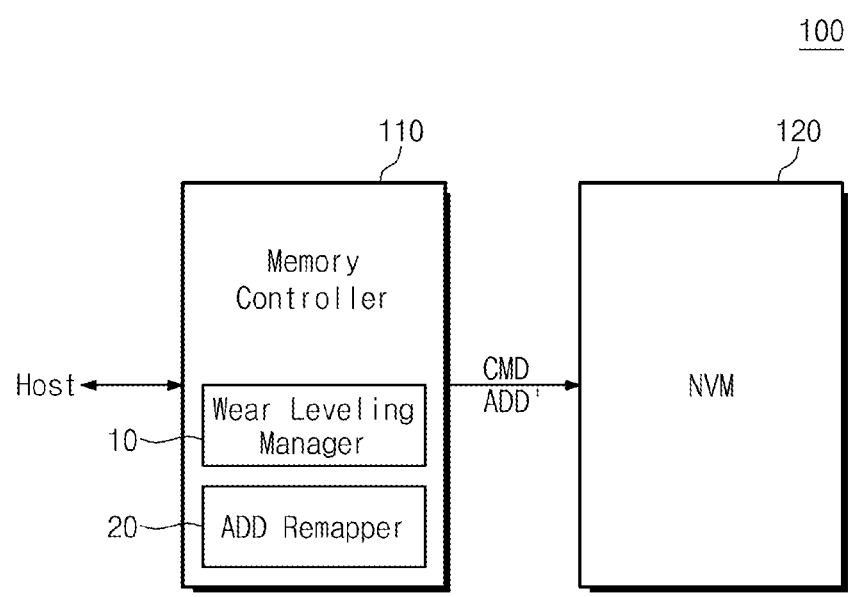
FIG. 1 is a block diagram schematically illustrating a memory system according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a memory system according to an embodiment of the inventive concept. Referring to FIG. 1, a memory system 100 may include a memory controller 110 and a nonvolatile memory device 120. The memory system 100 may adjust a selection sequence of string selection lines of the nonvolatile memory device 120 based on wear leveling information.

The memory controller 110 may control the nonvolatile memory device 120 in response to a write request from an external device. The memory controller 110 may provide the nonvolatile memory device 120 with a write command CMD and an address ADD' for selecting memory cells in response to a write request from a host. The memory controller 110 may select memory cells by a string selection line unit to store data at a selected memory block.

A memory block may include a plurality of cell strings that is formed in a direction perpendicular to a substrate. The memory block including the plurality of cell strings formed in the direction perpendicular to the substrate may be connected with a plurality of string selection lines. The plurality of cell strings may be selected by the plurality of string selection lines. When one of the plurality of string selection lines is selected, cell strings sharing the selected string selection line may be selected. Memory cells in the selected cell strings may be programmed.

The memory controller 110 may select cell strings in a selected memory block according to an arrangement order. Further, the memory controller 110 may select cell strings of a selected memory block in the inverse of an arrangement order, a zigzag sequence, or the like, based on wear leveling information.

The memory controller 110 may include a wear leveling manager 10 and an address remapper 20. The wear leveling manager 10 may store, update, and/or manage wear leveling information associated with all memory blocks of the nonvolatile memory device 120. The wear leveling manager 10 may be formed of firmware such as a flash translation layer (FTL), for example.

The address remapper 20 may reestablish a selection sequence of string selection lines of a selected memory block based on wear leveling information provided from the wear leveling manager 10. For example, the wear leveling information may include an erase count of a memory block. When an erase count of a memory block is below a reference value, the address remapper 20 may output an address ADD selected according to a sequence where string selection lines are arranged. When an erase count of a memory block exceeds the reference value, the address remapper 20 may output an address ADD' established such that a selection sequence of string selection lines is changed.

The nonvolatile memory device 120 may be a vertical nonvolatile memory device in which a channel of a cell string is formed to be perpendicular to a substrate. The nonvolatile memory device 120 may be a memory device in which a memory block is connected with at least two string selection lines. The nonvolatile memory device 120 may be formed of a NAND flash memory as a storage medium. However, the inventive concept is not limited thereto. For example, the nonvolatile memory device 120 may be formed of PRAM, MRAM, ReRAM, FRAM, or a combination of different types of memory devices, as a storage medium.

With the above description, the memory system 100 of the inventive concept may change a selection order of memory cells of a selected memory block, based on wear leveling information of the selected memory block. For example, when an erase count of a selected memory block is below a reference value, memory cells of the selected memory block may be selected according to an arrangement order of string selection lines. When an erase count of a selected memory block exceeds the reference value, memory cells of the selected memory block may be selected in the inverse of an arrangement order of string selection lines. In this manner, it is possible to equalize deterioration of memory cells of memory blocks in the nonvolatile memory device 120. That is, it is possible to extend the life of the nonvolatile memory device 120 or to improve the reliability of data.

Management of a flash memory device may be performed by a memory block unit to equalize wear leveling. However, when a selection sequence of a memory block is fixed, memory cells in the memory block may experience different voltage stresses. A NAND flash memory including cell strings formed to have a vertical structure may experience the above-described problem, which in some cases, can be serious. As word lines are stacked, memory cells at one layer may share a word line. Although a memory cell is connected with an unselected string selection line, a high program voltage supplied via a word line may be applied to the memory cell. This may lower the reliability of memory cells. The above-described problem may notably appear at memory cells, which are connected with a string selection line to be selected later, from among memory cells of a memory block. Stresses forced to memory cells in a memory block may be dispersed by changing a selection order of string selection lines based on wear leveling information. This will be more fully described with reference to FIG. 15.

As explained herein, selection order of string selection lines may be changed according to wear leveling information. However, the inventive concept is not limited thereto. For example, a selection order of string selection lines can be changed according to various data as well as wear leveling information such as an erase count.

Figure 2:
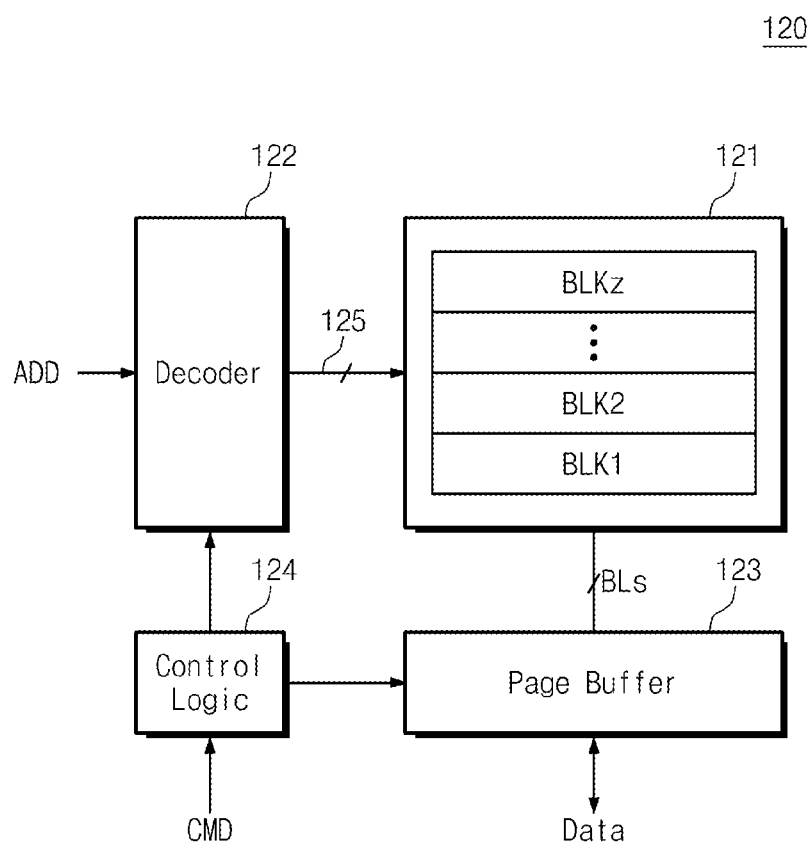
FIG. 2 is a block diagram schematically illustrating a nonvolatile memory device according to an embodiment of the inventive concept.

FIG. 2 is a block diagram schematically illustrating a nonvolatile memory device according to an embodiment of the inventive concept. Referring to FIG. 2, a nonvolatile memory device 120 may include a memory cell array 121, a decoder 122, a page buffer 123, and control logic 124.

The memory cell array 121 may be connected to the decoder 122 via lines 125, which may include word lines or selection lines SSL and GSL. The memory cell array 121 may be connected to the page buffer 123 via bit lines BLs. The memory cell array 121 may include a plurality of memory blocks BLK1 to BLKz, each of which may include a plurality of NAND cell strings. The plurality of NAND cell strings may be selected by a plurality of string selection lines.

In the memory cell array 121, each NAND cell string may have a channel formed in a vertical direction, and a plurality of word lines may be stacked in a vertical direction. A memory device in which the memory cell array 110 is formed to have the above-described string structure may be referred to as a vertical nonvolatile memory device or a three-dimensional nonvolatile memory device. Memory cells of a memory device in which cell strings are formed in a horizontal or vertical direction may be used as multi-level cells.

The decoder 122 may select any one of the memory blocks BLK1 to BLKz of the memory cell array 121 in response to an address ADD' adjusted by a memory controller 110. The decoder 120 may activate string selection lines of the selected memory block according to the adjusted address ADD'. With the adjusted address ADD', string selection lines may be selected in a sequence adjusted by the memory controller 110 according to wear leveling information (e.g., an erase count) of a memory block.

The decoder 122 may select one of word lines in the selected memory block. The decoder 122 may provide word lines of the selected memory block with word line voltages. At a programming operation, the decoder 122 may transfer a program voltage Vpgm and a verification voltage Vvfy to a selected word line and a pass voltage Vpass to an unselected word line, respectively. The decoder 122 may provide selection signals to the selection lines SSL and GSL to select a memory block, a sub block, or the like.

The page buffer 123 may operate as a write driver or a sense amplifier according to a mode of operation. At a programming operation, the page buffer 123 may provide a bit line of the memory cell array 121 with a bit line voltage corresponding to data to be programmed. At a read operation, the page buffer 123 may sense data stored in a selected memory cell via a bit line. The page buffer 123 may latch the sensed data to output it to an external device.

The control logic 124 may control the decoder 122 and the page buffer 123 in response to a command CMD from an external device. The control logic 124 may control the decoder 122 and the page buffer 123 to program input data at memory cells selected by the adjusted address ADD'.

The nonvolatile memory device 120 of the inventive concept may select memory cells in a selected memory block in response to an adjusted address ADD' provided from the memory controller 110. With the adjusted address ADD', a selection order of string selection lines may be switched when an erase count exceeds a reference value. It is possible to equalize or lower stresses forced to memory cells of a memory block by switching a selection order of string selection lines.

Figure 3:
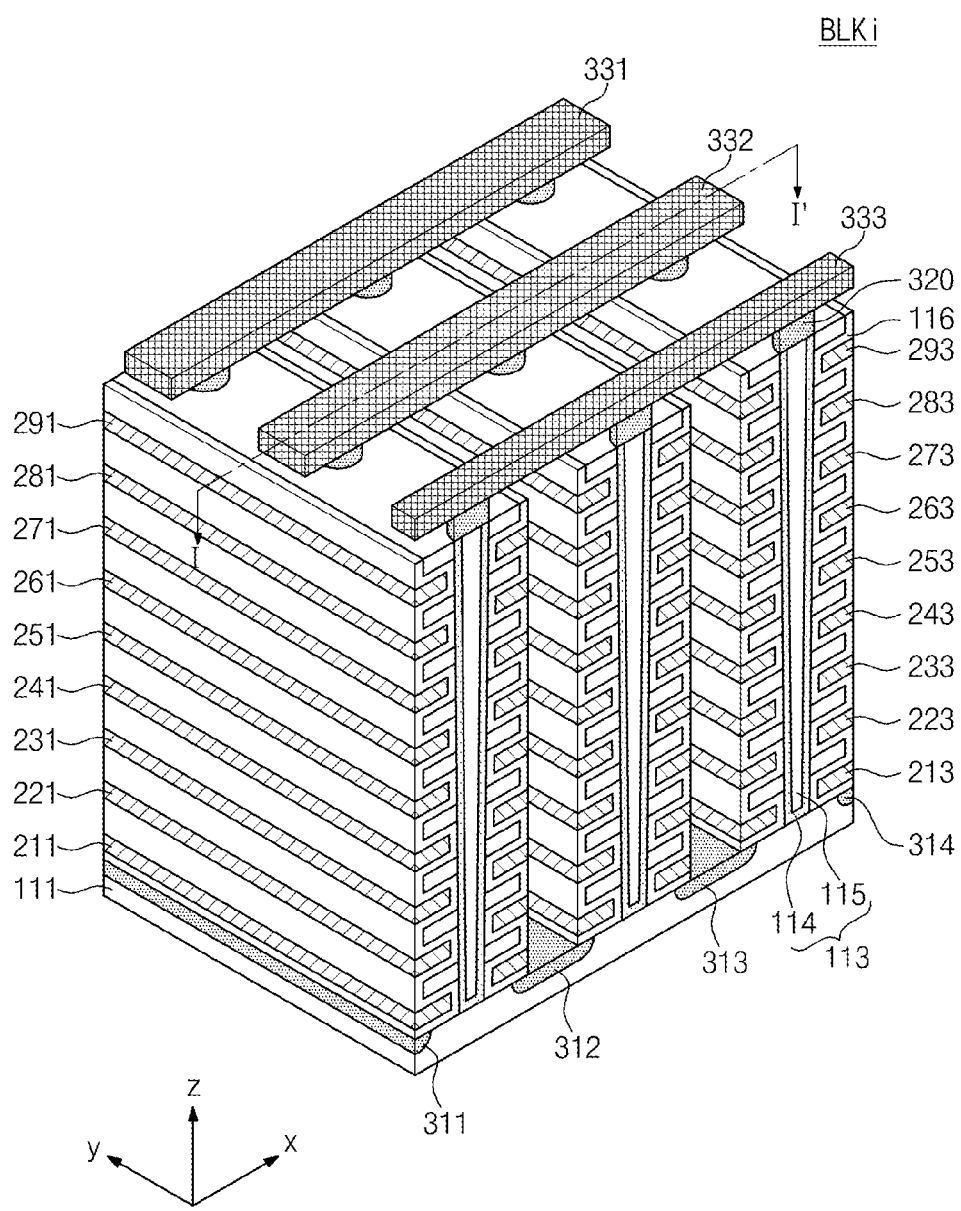
FIG. 3 is a perspective view illustrating one of memory blocks in FIG. 1.
Figure 4:
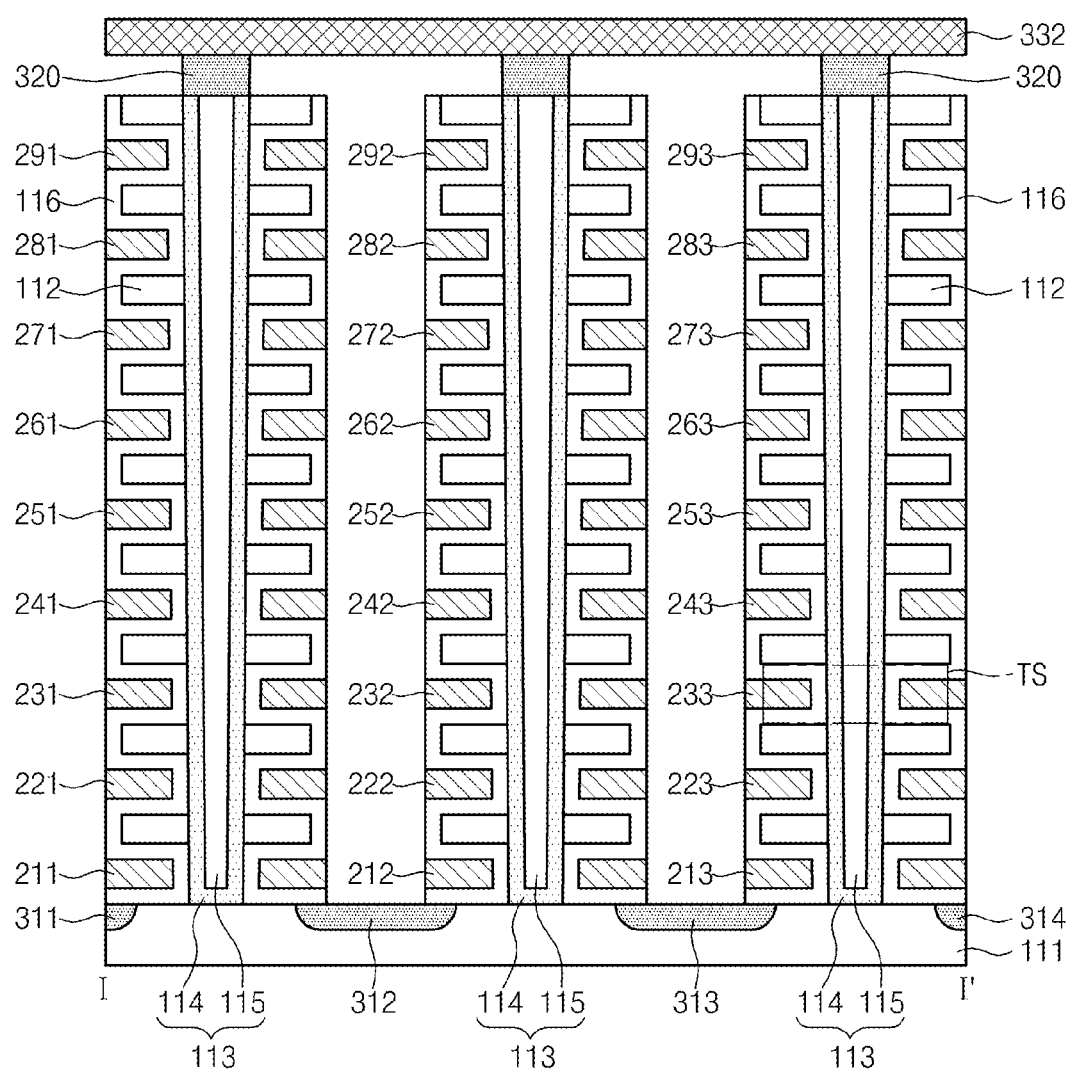
FIG. 4 is a cross-sectional view taken along a line I-I' illustrating a vertical NAND cell string in FIG. 3.

FIG. 3 is a perspective view illustrating one of memory blocks in FIG. 1. FIG. 4 is a cross-sectional view taken along a line I-I' illustrating a vertical NAND cell string in FIG. 3. Referring to FIG. 3, a memory block BLKi may include cell strings formed to have a three-dimensional (3D) or vertical structure. The memory block BLKi may include structures extending along a plurality of directions x, y, and z. Reference is now made to both FIGS. 3 and 4.

A substrate 111 may be provided to form the memory block BLKi. The substrate 111 may be formed of a p-well in which Group V such as boron is injected, for example. Alternatively, the substrate 111 may be a pocket p-well provided within an n-well. Below, it is assumed that the substrate 111 is a p-well. However, the substrate 111 is not limited to a p-well.

A plurality of doping regions 311 to 314 extending along the direction x may be provided in the substrate 111. For example, the plurality of doping regions 311 to 314 may be formed of n-type conductors different from the substrate 111.

Below, it is assumed that first to fourth doping regions 311 to 314 are n-type. However, the first to fourth doping regions 311 to 314 are not limited to the n-type.

On the substrate 111 between the first and second doping regions 311 and 312, a plurality of insulation materials 112 extending along the y-direction may be provided sequentially along the z-direction. The insulation materials 112 may be formed to be spaced apart along the z-direction. In example embodiments, the insulation materials 112 may include an insulation material such as silicon oxide.

On the substrate 111 between the first and second doping regions 311 and 312, a plurality of pillars 113 may be arranged sequentially along the y-direction so as to penetrate the plurality of insulation materials 112 along the z-direction. For example, the pillars 113 may contact with the substrate 111 through the insulation materials 112. The pillar 113 may be formed both on the substrate 111 between the second and third doping regions 312 and 313 and on the substrate between third and fourth doping regions 313 and 314.

In example embodiments, each pillar 113 may be formed of a plurality of materials. For example, a surface layer 114 of each pillar 113 may include a first type of silicon material. For example, the surface layer 114 of each pillar 113 may include a silicon material having the same type as the substrate 111. Below, it is assumed that the surface layer 114 of each pillar 113 includes p-type silicon. However, the surface layer 114 of each pillar 113 is not limited to the p-type silicon.

An inner layer 115 of each pillar 113 may be formed of an insulation material. For example, the inner layer 115 of each pillar 113 may include an insulation material such as silicon oxide. For example, the inner layer 115 of each pillar 113 may include air gap.

An insulation film 116 may be provided between the first and second doping regions 311 and 312 along exposed surfaces of the insulation materials 112, the pillars 113, and the substrate 111. In example embodiments, the insulation film 116 can be removed, which is provided on an exposed surface (toward the z-direction) of the last insulation material 112 provided along the z-direction.

At a region between the first and second doping regions 311 and 312, first conductive materials 211 to 291 may be provided on an exposed surface of the insulation film 116. For example, the first conductive material 211 extending along the y-direction may be provided between the substrate 111 and an insulation material 112 adjacent to the substrate 111. More specifically, the first conductive material 211 extending in the x-direction may be provided between the substrate 111 and an insulation film 116 of a lower surface of the insulation material 112 adjacent to the substrate 111.

The first conductive material extending along the y-direction may be provided between the insulation film 116 of an upper surface of a specific insulation material of the insulation materials 112 and the insulation film 116 of a lower surface of an insulation material disposed at an upper portion of the specific insulation material. In example embodiments, the first conductive materials 211 to 291 may include a metal material. In example embodiments, the first conductive materials 211 to 291 may include a conductive material such as polysilicon.

The same structure as that on the first and second doping regions 311 and 312 may be provided at an area between the second and third doping regions 312 and 313. For example, at an area between the second and third doping regions 312 and 313, there may be provided a plurality of insulation materials 112 extending in the y-direction, a plurality of pillars 113 disposed sequentially along the y-direction so as to penetrate the insulation materials 113 along the x-direction, an insulation film 116 provided on exposed surfaces of the plurality of pillars 113 and the plurality of insulation materials 112, and a plurality of first conductive materials 212 to 292 extending along the y-direction.

The same structure as that on the first and second doping regions 311 and 312 may be provided at an area between the third and fourth doping regions 313 and 314. For example, at an area between the third and fourth doping regions 313 and 314, there may be provided a plurality of insulation materials 112 extending in the y-direction, a plurality of pillars 113 disposed sequentially along the y-direction so as to penetrate the insulation materials 113 along the z-direction, an insulation film 116 provided on exposed surfaces of the plurality of pillars 113 and the plurality of insulation materials 112, and a plurality of conductive materials 213 to 293 extending along the y-direction.

Drains 320 may be provided on the pillars 113, respectively. The drains 320 may be second-type silicon materials. The drains 320 may be n-type silicon materials. Below, it is assumed that the drains 320 include n-type silicon materials. However, the drains 320 are not limited to include n-type silicon materials. A width of each drain 320 may be wider than that of a corresponding pillar 113. Each drain 320 may be provided on an upper surface of a corresponding pillar 113 in a pad fashion.

Referring to FIG. 4, a cell string may include a plurality of memory cells, which are formed around a pillar connected with a bit line. For ease of description, it is assumed that a cell string includes seven memory cells.

A pillar 113 may be formed between first and second doping regions 311 and 312 to penetrate a plurality of insulation materials 112 along a z-direction. The pillar 113 may contact with a substrate 111 via the insulation materials 112. The pillar 113 may include a channel film 114 and an inner material 115.

The channel film 114 may include a semiconductor material (e.g., silicon) having the first conductive type. For example, the channel film 114 may include a semiconductor material (e.g., silicon) having the same conductive type as the substrate 111. Below, it is assumed that the channel film 114 includes p-type silicon. However, the inventive concept is not limited thereto. For example, the channel film 114 may include intrinsic semiconductor being a non-conductive characteristic.

The inner material 115 may include an insulation material. For example, the inner material 115 may include an insulation material such as silicon oxide. For example, the inner material 115 may include air gap.

Information storage films 116 may be provided on exposed surfaces of the insulation materials 112 and the pillar 113 between the first and second doping regions 311 and 312. Conductive materials (e.g., 211 to 291, 212 to 292, and 213 to 293) may be provided on exposed surfaces of the insulation storage films 116 between adjacent doping regions 311 and 312.

The conductive materials (e.g., 211 to 291, 212 to 292, and 213 to 293) and the insulation materials 112 may be separated by word line cuts on the doping regions 311 and 312. In example embodiments, conductive materials (e.g., 211 to 291, 212 to 292, and 213 to 293) may include a metallic conductive material. The conductive materials may include a non-metallic conductive material such as polysilicon.

A drain 320 may be formed on the pillar 113. In example embodiments, the drain 320 may include a semiconductor material (e.g., silicon) having the second conductive type. For example, the drain 320 may include an n-type semiconductor material (e.g., silicon). Below, it is assumed that the drain 320 includes n-type silicon. However, the inventive concept is not limited thereto. In example embodiments, the drain 320 may be extended toward a top of the channel film 114 of the pillar 113.

A bit line BL (e.g., 331, 332 and 333) extending in an x-direction may be provided on the drain 320. The bit line BL may be connected with the drain 320. In example embodiments, the drain 320 and the bit line BL may be interconnected via a contact plug (not shown). In example embodiments, the bit line BL may include a metallic conductive material. In example embodiments, the bit line BL may include a non-metallic conductive material such as polysilicon.

Figure 5:
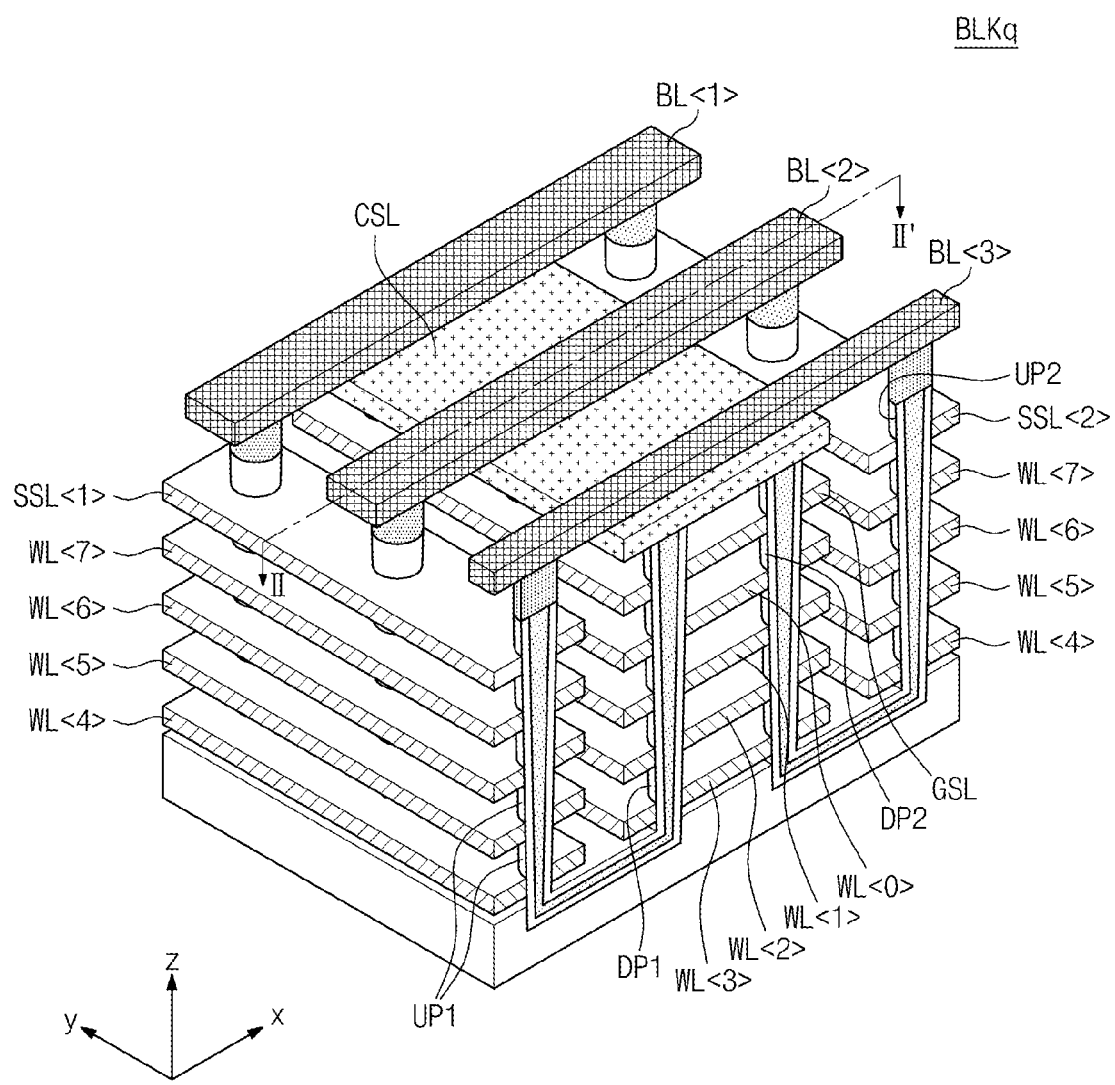
FIG. 5 is a perspective view of a vertical nonvolatile memory according to another embodiment of the inventive concept.
Figure 6:
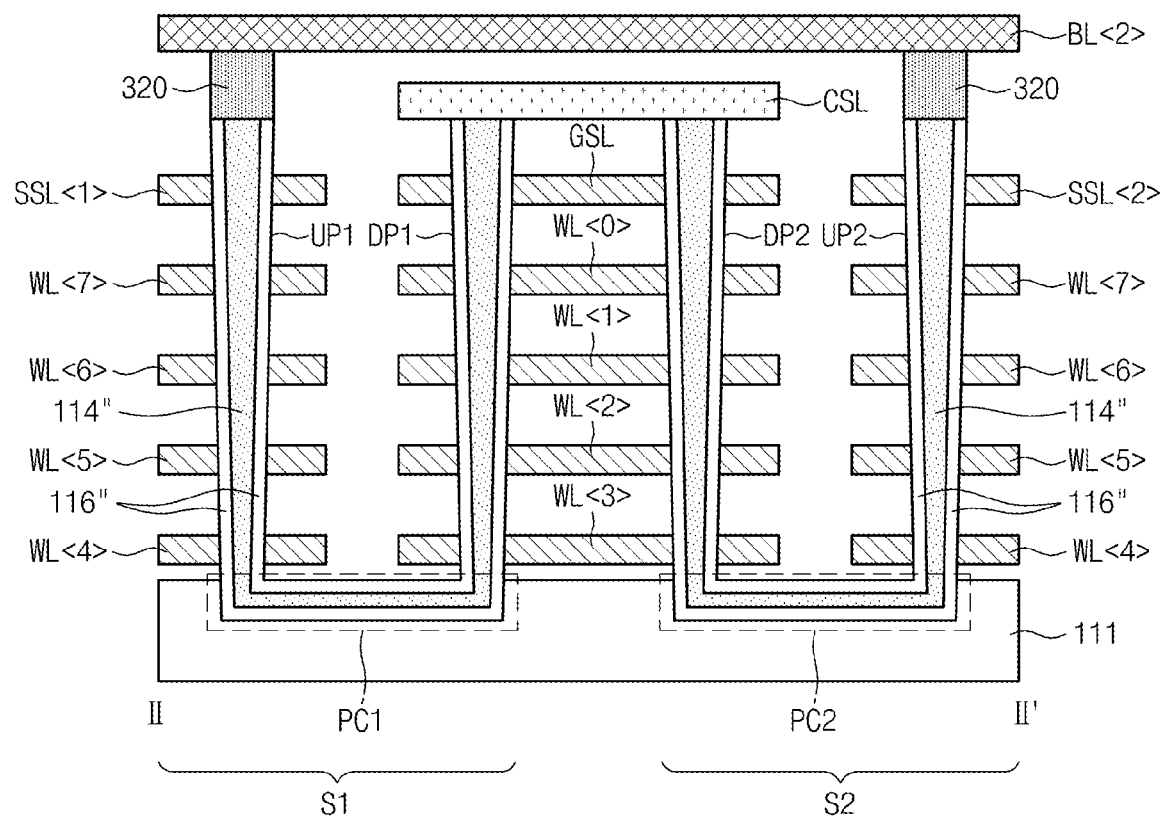
FIG. 6 is a cross-sectional view taken along a line II-II' in FIG. 6.

FIG. 5 is a perspective view of a vertical nonvolatile memory according to another embodiment of the inventive concept. FIG. 6 is a cross-sectional view taken along a line II-II' in FIG. 6.

Referring to FIGS. 5 and 6, word lines WL4, WL5, WL6, and WL7 extending along a y-direction may be sequentially provided on a substrate 111 along a z-direction. The word lines WL4, WL5, WL6, and WL7 may be spaced apart along the z-direction. First upper pillars UP1 may be disposed sequentially along the y-direction to penetrate the word lines WL4, WL5, WL6, and WL7. Herein, the word lines WL4, WL5, WL6, and WL7 may be referred to as upper word lines.

On the substrate 111, word lines WL0, WL1, WL2, and WL3 extending in the y-direction may be provided sequentially along the z-direction. The word lines WL0, WL1, WL2, and WL3 may be spaced apart in the z-direction. First lower pillars DP1 may be disposed sequentially in the y-direction to penetrate the word lines WL0, WL1, WL2, and WL3 in the z-direction. Second lower pillars DP2 may be disposed sequentially in the y-direction to penetrate the word lines WL0, WL1, WL2, and WL3 in the z-direction. In example embodiments, the first lower pillars DP1 and the second lower pillars DP2 may be disposed in parallel along the z-direction. Herein, the word lines WL0, WL1, WL2, and WL3 may be referred to as lower word lines.

On the substrate 111, the word lines WL4, WL5, WL6, and WL7 extending along the y-direction may be sequentially provided along the z-direction. The word lines WL4, WL5, WL6, and WL7 may be spaced apart along the z-direction. Second upper pillars UP2 may be disposed sequentially along the y-direction to penetrate the word lines WL4, WL5, WL6, and WL7 along the z-direction.

A common source line CSL extending in the y-direction may be provided on the first and second lower pillars DP1 and DP2. In example embodiments, the common source line CSL may be n-type silicon. In example embodiments, in the event that the common source line CSL is formed of metal or a non-polar conductive material such as polysilicon, n-type sources may be additionally provided between the common source line CSL and the first and second lower pillars DP1 and DP2. In example embodiments, the common source line CSL and the first and second lower pillars DP1 and DP2 may be connected via contact plugs, respectively.

Drains 320 may be provided on the first and second upper pillars UP1 and UP2, respectively. In example embodiments, the drains 320 may be n-type silicon. On the drains 320, a plurality of bit lines BL1 to BL3 extending along the x-direction may be provided sequentially in the y-direction. In example embodiments, the bit lines BL1 to BL3 and the drains 320 may be connected via contact plugs.

Each of the first and second upper pillars UP1 and UP2 may include a surface layer 116" and an inner layer 114". Each of the first and second lower pillars DP1 and DP2 may include a surface layer 116" and an inner layer 114". The surface layers 116" of the first and second upper pillars UP1 and UP2 and the first and second lower pillars DP1 and DP2 may include a blocking insulation film, a charge storage film, and a tunneling insulation film, respectively.

The inner layers 114" of the first and second upper pillars UP1 and UP2 and the first and second lower pillars DP1 and DP2 may be p-type silicon, respectively. The inner layers 114" of the first and second upper pillars UP1 and UP2 and the first and second lower pillars DP1 and DP2 may act as a body.

The first upper pillars UP1 may be connected with the first lower pillars DP1 via the first pipeline contacts PC1, respectively. In example embodiments, the surface layers 116" of the first upper pillars UP1 may be connected with surface layers those of the first lower pillars DP1 via the first pipeline contacts PC1, respectively. Surface layers of the first pipeline contacts PC1 may be formed of the same material as the surface layers 116" of the pillars UP1 and DP1.

In example embodiments, inner layers 114" of the first upper pillars UP1 may be connected with those of the first lower pillars DP1 via inner layers of the first pipeline contacts PC1, respectively. The inner layers of the first pipeline contacts PC1 may be formed of the same material as the inner layers 114" of the pillars UP1 and DP1.

That is, the first upper pillars UP1 and the word lines WL4, WL5, WL6, and WL7 may form first upper strings, and the first lower pillars DP1 and the word lines WL0, WL1, WL2, and WL3 may form first lower strings. The first upper strings may be connected with the first lower strings via the first pipeline contacts PC1, respectively. The drains 320 and the bit lines BL1 to BL3 may be connected with one or more ends of the first upper strings. A common source line CSL may be connected with one or more ends of the first lower strings. That is, the first upper strings and the first lower strings may form a plurality of strings connected between the bit lines BL1 to BL3 and the common source line CSL.

Similarly, the second upper pillars UP2 and the word lines WL4, WL5, WL6, and WL7 may form second upper strings, and the second lower pillars DP2 and the word lines WL0, WL1, WL2, and WL3 may form second lower strings. The second upper strings may be connected with the second lower strings via the second pipeline contacts PC2, respectively. The drains 320 and the bit lines BL1 to BL3 may be connected with one or more ends of the second upper strings. The common source line CSL is connected with one or more ends of the second lower strings. That is, the second upper strings and the second lower strings may form a plurality of strings connected between the bit lines BL1 to BL3 and the common source line CSL.

In example embodiments, first and second pipeline contact gates (not shown) may be provided to form a channel at the bodies (i.e., inner layer 114") of the first and second pipeline contacts PC1 and PC2, respectively. For example, the first and second pipeline contact gates may be provided on surfaces of the first and second pipeline contacts PC1 and PC2, respectively.

The word lines WL0, WL1, WL2, and WL3 may be shared at adjacent lower pillars DP1 and DP2. However, when upper pillars adjacent to upper pillars UP1 and UP2 are added, the adjacent upper pillars may be configured to share the word lines WL4, WL5, WL6, and WL7.

With the vertical nonvolatile memory device described with reference to FIGS. 3 to 6, a memory block may include a plurality of cell strings, each of which is selected by at least two string selection lines. However, memory cells formed at the same layer may be exposed to a program voltage although they are connected with an unselected string selection line.

Figure 7:
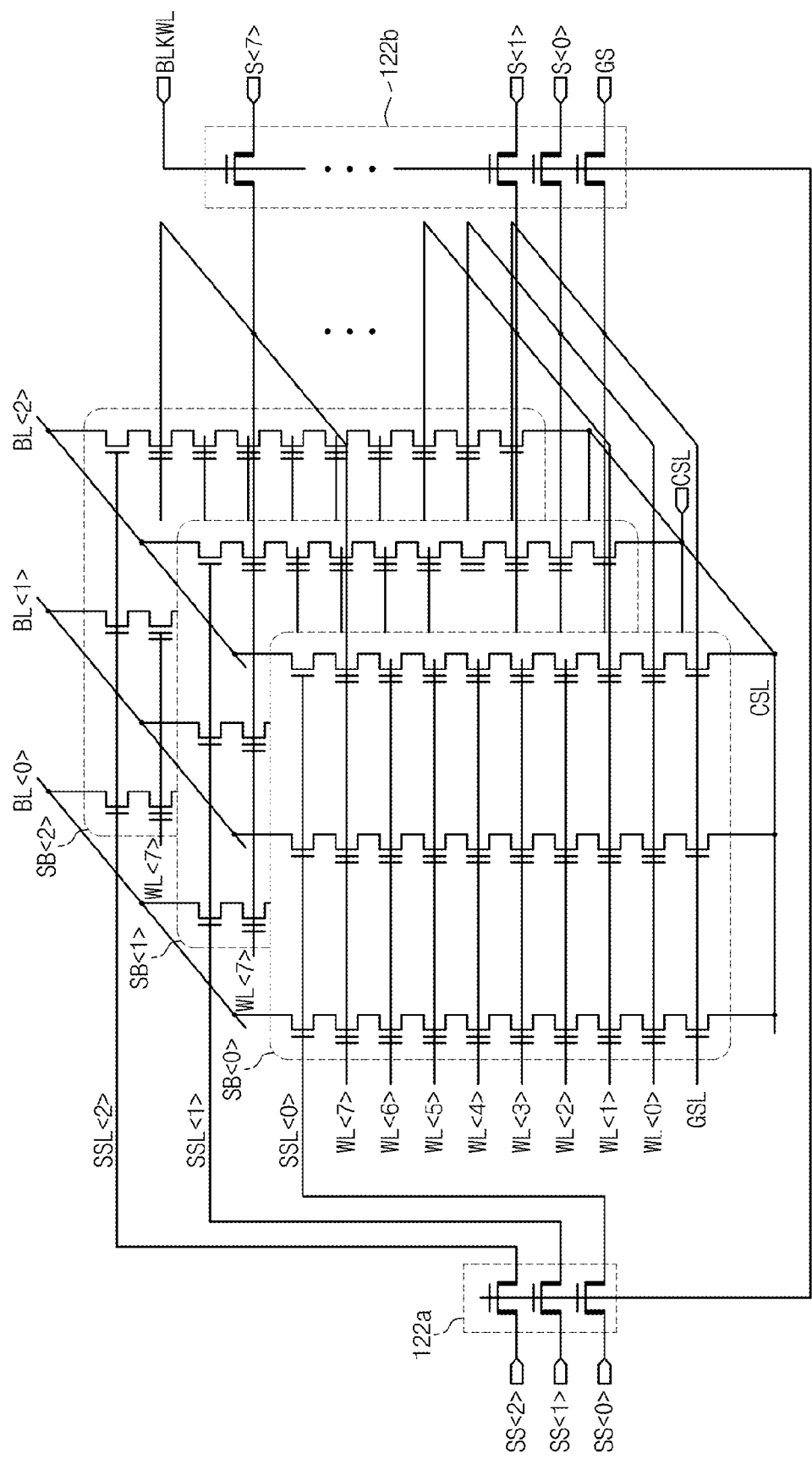
FIG. 7 is a circuit diagram schematically illustrating a selection structure of a nonvolatile memory device according to an embodiment of the inventive concept.

FIG. 7 is a circuit diagram schematically illustrating a selection structure of a nonvolatile memory device according to an embodiment of the inventive concept. Referring to FIG. 7, a memory block may include a plurality of cell strings. The memory block may be connected with a plurality of string selection lines SSL<0> to SSL<2> for selecting the plurality of cell string.

One or more memory blocks may be selected by activation of a block selection signal BLKWL of a memory block to be selected. Path transistors 122a and 122b in a decoder 122 may be turned on or off by the block selection signal BLKWL. Selection signals SS<0> to SS<2> may be transferred to string selection lines SSL<0> to SSL<2> through the path transistors 122a. Driving signals S<0> to S<7> may be transferred to lines WL<0> to WL<7> and GSL through the path transistors 122b.

When the selection signal SS<0> is activated, cell strings connected with the string selection line SSL<0> may be electrically connected to bit lines BL<0> to BL<2>, respectively. Memory cells in a sub block SB<0> may be programmed when the driving signals S<0> to S<7> are supplied. When the selection signal SS<1> is activated, cell strings connected with the string selection line SSL<1> may be electrically connected to the bit lines BL<0> to BL<2>, respectively. Memory cells in a sub block SB<1> may be programmed when the driving signals S<0> to S<7> are supplied. When the selection signal SS<2> is activated, cell strings connected with the string selection line SSL<2> may be electrically connected to the bit lines BL<0> to BL<2>, respectively. Memory cells in a sub block SB<2> may be programmed when the driving signals S<0> to S<7>are supplied.

With the inventive concept, an activation sequence of the selection signals SS<0> to SS<2> may be changed according to wear leveling information of a selected memory block. In this case, it is possible to remarkably reduce voltage stresses of specific memory cells in a memory block due to a fixed selection sequence of string selection lines. This will be more fully described below.

FIGS. 8A to 8D are diagrams illustrating selection sequences of string selection lines according to an embodiment of the inventive concept.

Figure 8A:
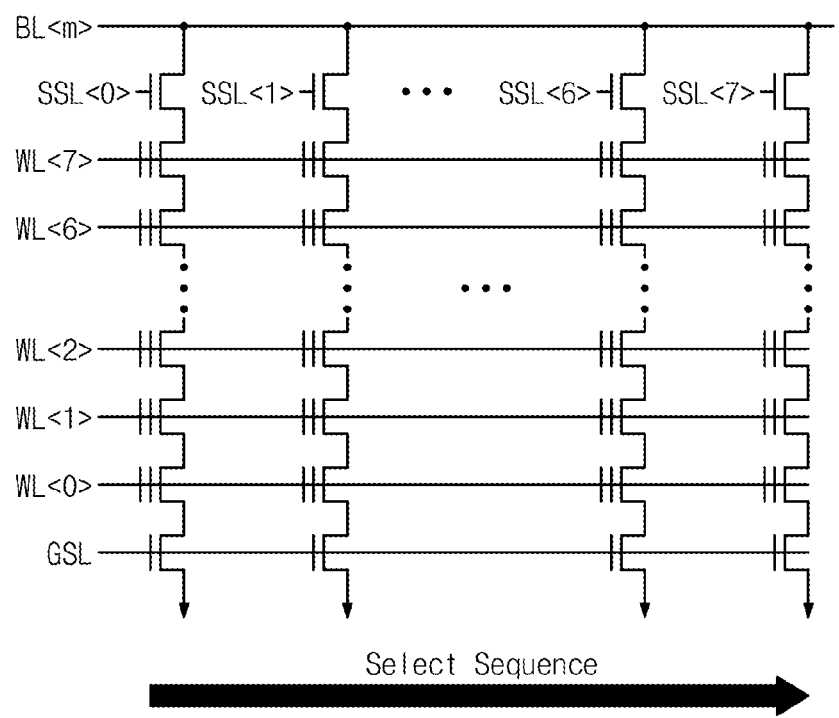

FIG. 8A shows a case in which memory cells are sequentially selected according to an arrangement order of string selection lines SSL<0> to SSL<7>. In a selected memory block, memory cells connected with a string selection line SSL<0>may be selected. For example, when a power supply voltage Vcc is applied to the string selection line SSL<0> and a ground voltage (e.g., 0V) is applied to the string selection lines SSL<1> to SSL<7>, memory cells connected with the string selection line SSL<0> may be selected. Memory cells of selected cell strings may be programmed by a program voltage sequentially applied to word lines WL<0> to WL<7>.

When a power supply voltage Vcc is applied to the string selection line SSL<1> and a ground voltage (e.g., 0V) is applied to the string selection lines SSL<0> and SSL<2> to SSL<7>, memory cells connected with the string selection line SSL<1> may be selected. Memory cells of selected cell strings may be programmed by a program voltage sequentially applied to the word lines WL<0> to WL<7>. The remaining string selection lines SSL<2> to SSL<7> may be sequentially selected in the same or similar manner as described above.

A selection sequence of string selection lines in FIG. 8A may be used as a default of a general nonvolatile memory device. That is, when an erase count is below a reference value, a memory controller 110 may generate an address ADD such that string selection lines are selected as illustrated in FIG. 8A.

Figure 8B:
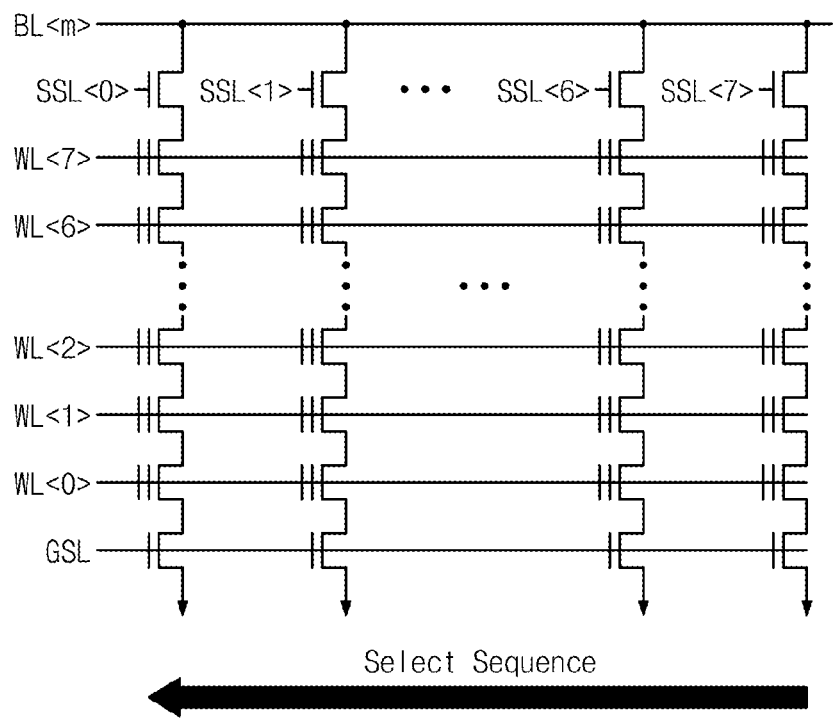

FIG. 8B shows a case that string selection lines are selected in the inverse of a sequence illustrated in FIG. 8A. That is, in a selected memory block, memory cells connected with a string selection line SSL<7> may be first selected. When a power supply voltage Vcc is applied to the string selection line SSL<7> and a ground voltage (e.g., 0V) is applied to the string selection lines SSL<0> to SSL<6>, memory cells connected with the string selection line SSL<7> may be selected. Memory cells of selected cell strings may be programmed by a program voltage sequentially applied to the word lines WL<0> to WL<7>.

When a power supply voltage Vcc is applied to the string selection line SSL<6> and a ground voltage (e.g., 0V) is applied to the string selection lines SSL<0> to SSL<5> and SSL<7>, memory cells connected with the string selection line SSL<6> may be selected. Memory cells of selected cell strings may be programmed by a program voltage sequentially applied to the word lines WL<0> to WL<7>. The remaining string selection lines SSL<0> to SSL<5> may be sequentially selected in the same or similar manner as described above.

FIG. 8C shows a case that string selection lines are selected toward the outside from a center. As illustrated in FIG. 8C, string selection lines SSL<0> to SSL<7> may be selected according to a first selection manner ME1 or a second selection manner ME2.

With the first selection manner ME1, memory cells of a selected memory block connected with a string selection line SSL<3> may be first selected. Afterwards, a string selection line SSL<2>, a string selection line SSL<1>, and a string selection line SSL<0> may be sequentially selected. This selection sequence may be illustrated by an arrow denoted by ①. Then, memory cells of a selected memory block connected with a string selection line SSL<4> may be first selected. Afterwards, a string selection line SSL<5>, a string selection line SSL<6>, and a string selection line SSL<7> may be sequentially selected. This selection sequence may be illustrated by an arrow denoted by ②.

With the second selection manner ME2, memory cells of a selected memory block connected with a string selection line SSL<4> may be first selected. Afterwards, a string selection line SSL<5>, a string selection line SSL<6>, and a string selection line SSL<7> may be sequentially selected. This selection sequence may be illustrated by an arrow denoted by ①. Then, memory cells of a selected memory block connected with a string selection line SSL<3> may be first selected. Afterwards, a string selection line SSL<2>, a string selection line SSL<1>, and a string selection line SSL<0> may be sequentially selected. This selection sequence may be illustrated by an arrow denoted by ②.

FIG. 8D shows another case that string selection lines are selected toward the outside from a center. As illustrated in FIG. 8D, string selection lines SSL<0> to SSL<7> may be selected according to a first zigzag manner Zig1 or a second zigzag manner Zig2.

With the first zigzag manner Zig1, memory cells of a selected memory block connected with a string selection line SSL<3> may be first selected. Afterwards, a string selection line SSL<4>, a string selection line SSL<2>, a string selection line SSL<5>, and a string selection line SSL<1> may be sequentially selected. Then, a string selection line SSL<6>, a string selection line SSL<0>, and a string selection line SSL<7> may be sequentially selected.

With the second zigzag manner Zig2, memory cells of a selected memory block connected with a string selection line SSL<4> may be first selected. Afterwards, a string selection line SSL<3>, a string selection line SSL<5>, a string selection line SSL<2>, and a string selection line SSL<6> may be sequentially selected. Then, a string selection line SSL<1>, a string selection line SSL<7>, and a string selection line SSL<0> may be sequentially selected.

The above-described selection sequences of string selection lines in a memory block may be exemplary. An address may be adjusted to select string selection lines in various selection sequences based on wear leveling information of the selected memory block.

Figure 9:
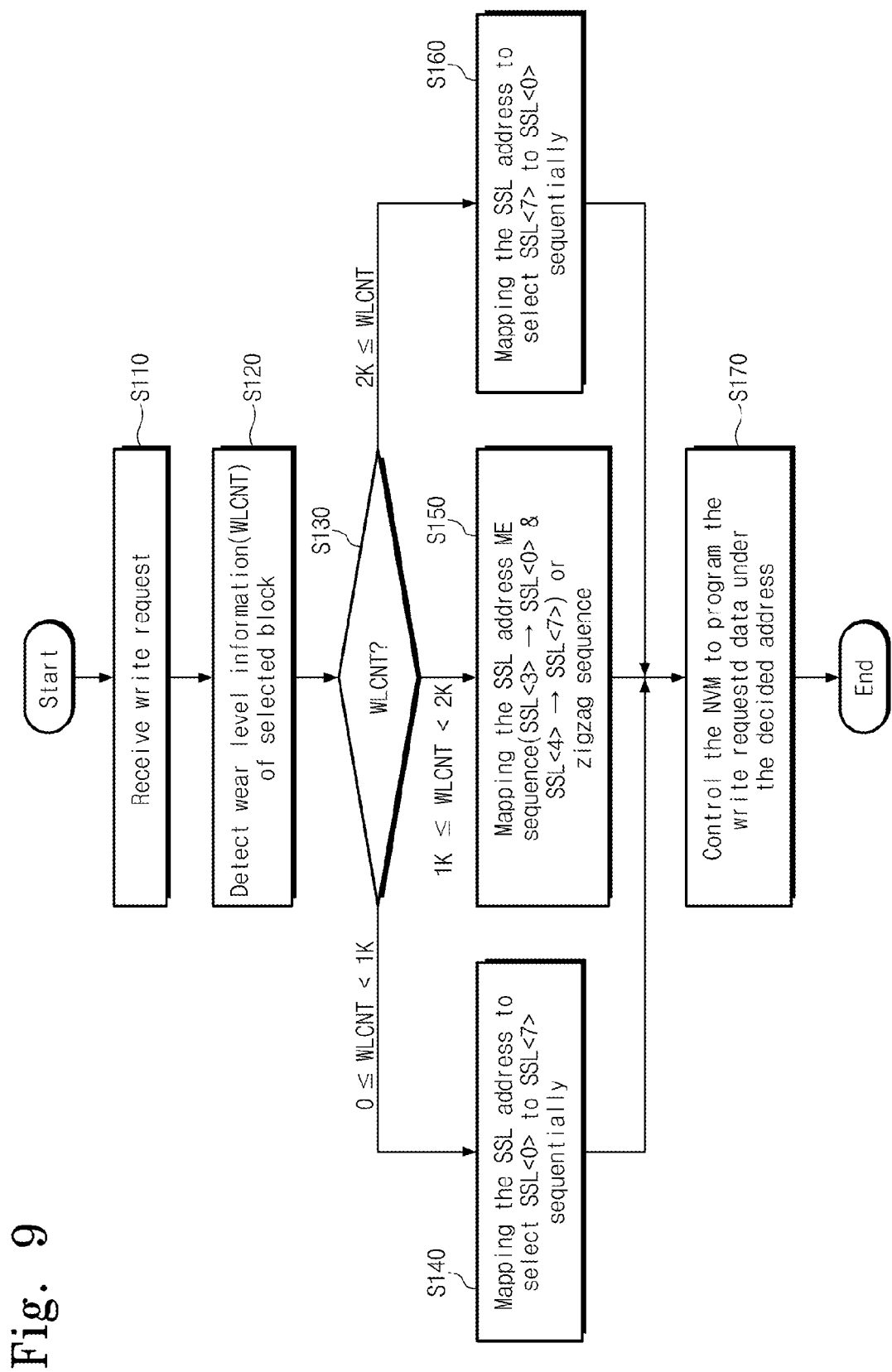
FIG. 9 is a flowchart schematically illustrating a programming method executed at a memory system in FIG. 1.

FIG. 9 is a flowchart schematically illustrating a programming method executed at a memory system in FIG. 1. Referring to FIG. 9, at a programming operation, a memory controller 110 may reconfigure an address of a string selection line based on wear leveling information WLCNT of a selected memory block. Below, the wear leveling information WLCNT will be described in light of an erase count.

In operation S110, if a write operation is requested by a host, a memory controller 110 may be provided with a logical address corresponding to the write request. In general, the logical address provided from the host may be mapped to a physical address through a flash translation layer (FTL). With the mapping address ADD, string selection lines of a memory block may be sequentially selected according to an arrangement order.

In operation S120, the memory controller 110 may detect wear leveling information (e.g., an erase count) of the selected memory block. In example embodiments, the wear leveling information (e.g., an erase count) of the selected memory block may be provided from a wear leveling manager 10 of the memory controller 110.

In operation S130, the memory controller 110 may compare a value of the wear leveling information WLCNT and reference values, and the method may be diverged according to a comparison result. When a value of the wear leveling information WLCNT is smaller than a reference value of 1K (1024), the method proceeds to operation S140. When a value of the wear leveling information WLCNT is larger than or equal to the reference value of 1K (1024) and lower than a reference value of 2K (2048), the method proceeds to operation S150. When a value of the wear leveling information WLCNT is larger than or equal to a reference value of 2K (2048), the method proceeds to operation S160. As described herein, memory blocks may be classified into three groups according to the wear leveling information WLCNT. However, the inventive concept is not limited thereto. For example, memory blocks may be classified into two groups or four or more groups according to the wear leveling information WLCNT.

In operation S140, the memory controller 110 may maintain a string selection line address, associated with a memory block having a value of wear leveling information WLCNT larger than or equal to 0 and smaller than 1K (1024), to have a default value. An address remapper 20 of the memory controller 110 may establish a string selection line address such that string selection lines of a selected memory block are selected according to an arrangement order of SSL<0> to SSL<7> (e.g., an ascending sequence). In the event that a default value is set such that a selection sequence of string selection lines follows an arrangement order, the address remapper 20 may bypass a string selection line address corresponding to the default value.

In operation S150, the memory controller 110 may reconfigure a string selection line address associated with a memory block having a value of wear leveling information WLCNT larger than or equal to 1K and smaller than 2K. The address remapper 20 of the memory controller 110 may establish a string selection line address such that string selection lines of a selected memory block are selected to be different an arrangement order of SSL<0> to SSL<7>. For example, the address remapper 20 may adjust a string selection line address such that string selection lines are selected according to one of sequences illustrated in FIGS. 8C and 8D.

In operation S160, the memory controller 110 may adjust a string selection line address, associated with a memory block having a value of wear leveling information WLCNT larger than or equal to 2K, such that string selection lines are selected in the inverse of an arrangement order (e.g., a descending sequence). For example, the address remapper 20 of the memory controller 110 may adjust a string selection line address such that string selection lines of a selected memory block are selected in the inverse SSL<7> to SSL<0> of an arrangement order of SSL<0> to SSL<7>.

In operation S140, S150, and S160, the adjusted address including an adjusted string selection line address may be called a secondary physical address. Compared to the secondary physical address, the physical address which is generated by the FTL may be called a primary physical address. The ADD remapper 20 in FIG. 1 may convert the primary physical address to the secondary physical address by its own mapping table or mapping rule according to the mapping rule shown in the steps of S140, S150 and S160. If the remapper bypasses the primary physical address, the secondary physical address is the same as the primary address.

In another embodiment of the inventive concept, the FTL may include the remapper. The FTL may receive a logical address from a host and generate a physical address, which may reflect the adjusted sequence to select the string selection line addresses.

In operation S170, the memory controller 110 may program data at a selected memory block according to the bypassed or adjusted string selection line address.

With the above description, the memory controller 110 may selectively adjust a string selection line address according to wear leveling information WLCNT. Thus, the nonvolatile memory device 120 need not adjust a string selection line address or include a function of supporting adjustment of a string selection line address.

FIGS. 10A to 10H are timing diagrams illustrating a method of providing a write command and an address associated with a selected memory block from a memory controller. A memory controller 110 (as shown in FIG. 1) may decide an output order of string selection line addresses according to wear leveling information WLCTN of a selected memory block. The memory controller 110 may provide a nonvolatile memory device 120 with an address for selecting memory cells, based on the decided order. Herein, a variation of row and column addresses may be skipped to describe a transfer sequence of string selection line addresses. Row and column addresses provided many times in connection with a string selection line address may not be illustrated at a write command sequence. However, the position of the string selection line addresses is not limited thereto in this or other embodiments disclosed herein. The string selection line address may be assigned to a part of column address, row address, or block address. The arrangement of an address sequence and its definition of the address sequence may be different according to a cell array structure of the nonvolatile memory device 120. The size of the data transfer before programming can be different according to the architecture such as a size of page buffers, address buffer, and command latch of the nonvolatile memory device 110. The size of the data transfer may be a unit of one or more pages.

Figure 10A:
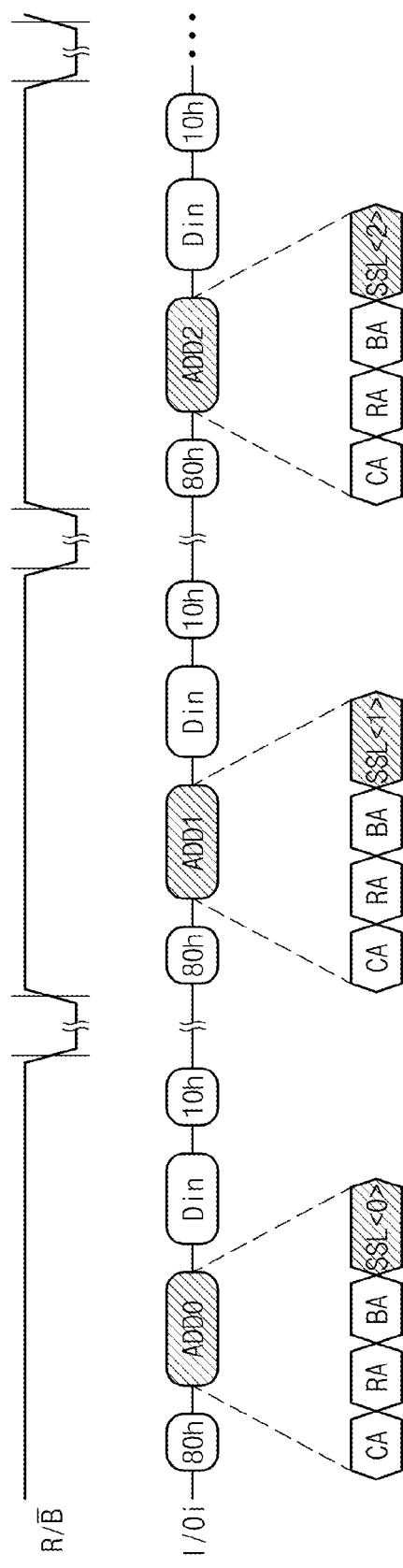

Referring to FIG. 10A, the memory controller 110 may provide the nonvolatile memory device 120 with string selection line addresses of a selected memory block according to an arrangement order. The memory controller 110 may provide the nonvolatile memory device 120 with a write command sequence. When a status signal R/B of the nonvolatile memory device 120 is at a ready state (e.g., at a high state), the memory controller 110 may provide a write command sequence of 80h-ADD0-Din-10h with input/output terminals I/Oi of the nonvolatile memory device 120. The nonvolatile memory device 120 may switch a state of the status signal R/B into a busy state (e.g., a low state) in response to an input of '10h' indicating program confirm. The nonvolatile memory device 120 may program input data Din at a memory region corresponding to an address ADD0.

As illustrated in FIG. 10A, the address ADD0 may include a column address CA, a row address RA, a block address BA, and a string selection line address SSL<0>. One command sequence on a selected string selection line SSL<0> may be illustrated. However, it is well understood that write command sequences are successively provided with respect to respective columns and respective word lines (e.g., WL<0> to WL<7>). For ease of description, the case in which only string selection lines SSL<0>, SSL<1>, and SSL<2> are representatively illustrated at a command sequence. An address ADD1 may include a column address CA, a row address RA, a block address BA, and a string selection line address SSL<1>. An address ADD2 may include a column address CA, a row address RA, a block address BA, and a string selection line address SSL<2>.

With the above description, string selection lines of a selected memory block may be selected sequentially according to an arrangement order: SSL<0> to SSL<7>.

Figure 10B:
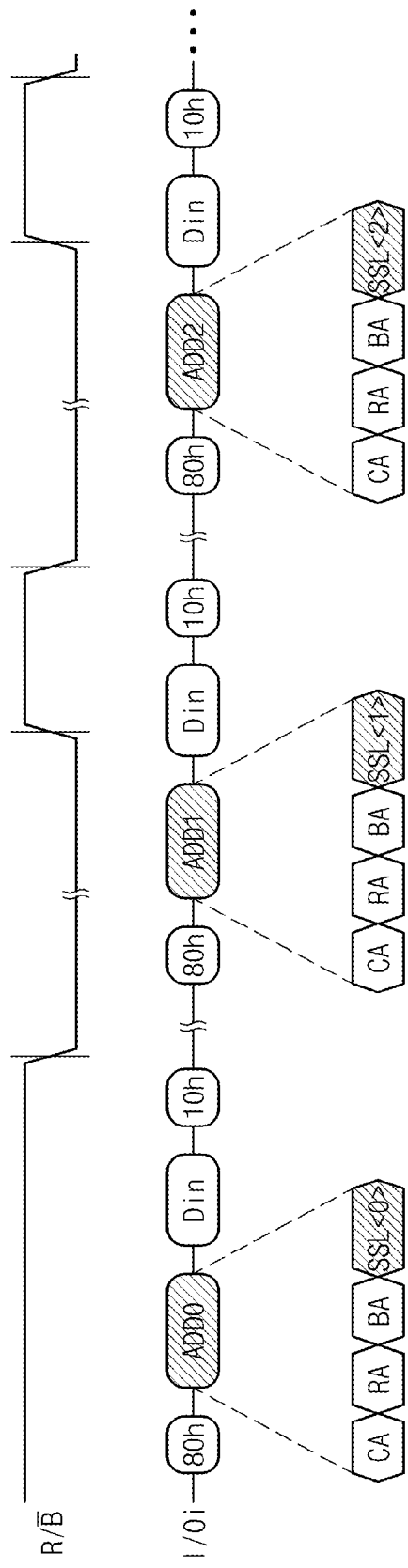

Referring to FIG. 10B, the memory controller 110 may provide the nonvolatile memory device 120 with a program command, column and row address, block address, string selection line address, and/or serial data while the status signal R/B of the nonvolatile memory device 120 is at a busy state (e.g., a low state) during programming of previous data at the cells in the selected string. The amount of data transfer depends on a capacity of a page buffer of the nonvolatile memory device 120. If the nonvolatile memory device can prepare a next programming operation during programming the currently selected cell strings by storing a next command, next address, and/or next data, the nonvolatile memory device 120 may save the program time.

Figure 10C:
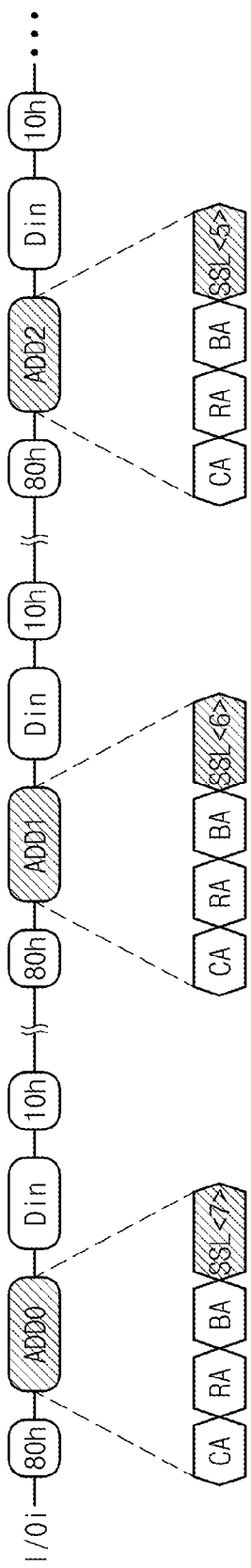

Referring to FIG. 10C, the memory controller 110 may provide the nonvolatile memory device 120 with string selection line addresses of a selected memory block in the inverse of the arrangement order.

An address ADD0 may include a column address CA, a row address RA, a block address BA, and a string selection line address SSL<7>. An address ADD1 may include a column address CA, a row address RA, a block address BA, and a string selection line address SSL<6>. An address ADD2 may include a column address CA, a row address RA, a block address BA, and a string selection line address SSL<5>. With the above description, string selection lines of a selected memory block may be selected sequentially according to the inverse of the arrangement order: SSL<7> to SSL<0>.

Figure 10D:
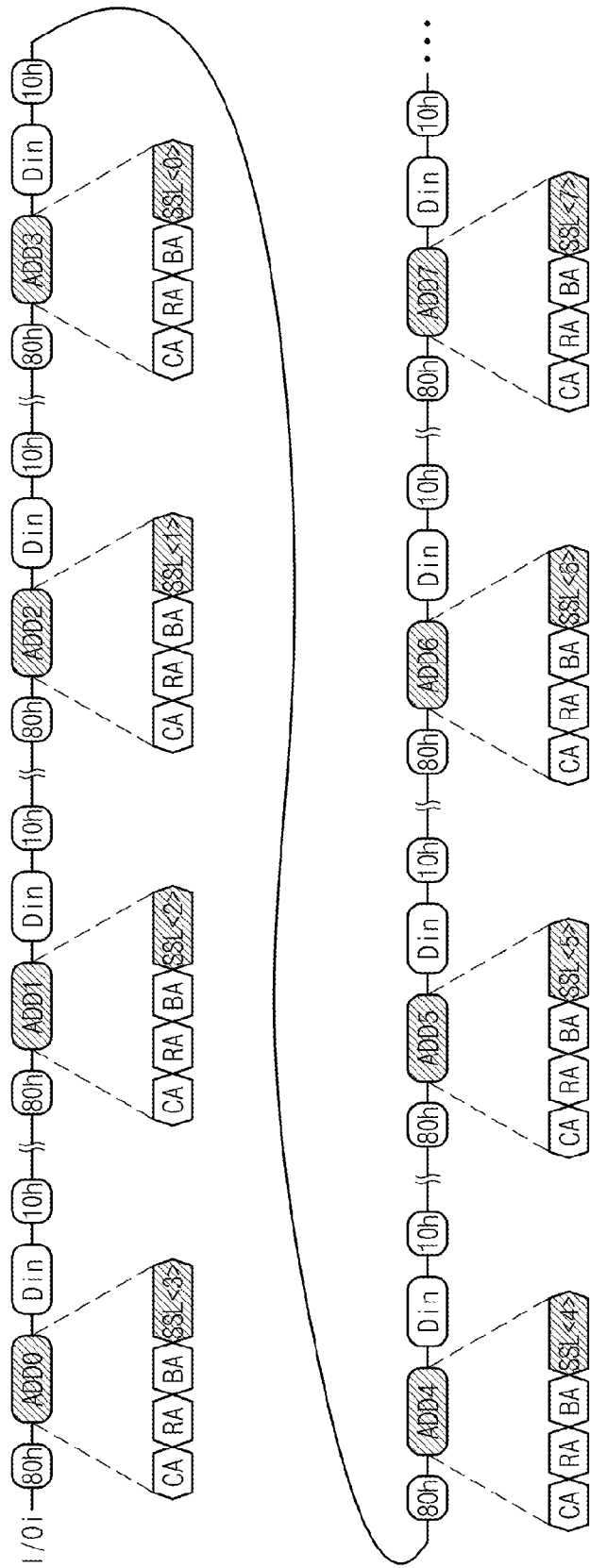

Referring to FIG. 10D, a write command sequence corresponding to a first selection manner ME1 in FIG. 8C is illustrated. The memory controller 110 may provide string selection line addresses of a selected memory block toward an edge from a center. Write command sequences with respect to respective columns or respective word lines (e.g., WL<0> to WL<7>) follow write command sequences corresponding to string selection lines.

An address ADD0 may include a string selection line address SSL<3>, an address ADD1 may include a string selection line address SSL<2>, an address ADD2 may include a string selection line address SSL<1>, and an address ADD3 may include a string selection line address SSL<0>. Then, an address ADD4 may include a string selection line address SSL<4>, an address ADD5 may include a string selection line address SSL<5>, an address ADD6 may include a string selection line address SSL<6>, and an address ADD7 may include a string selection line address SSL<7>.

This sequence is partially changed to apply a second selection manner ME2 in FIG. 8C.

Figure 10E:
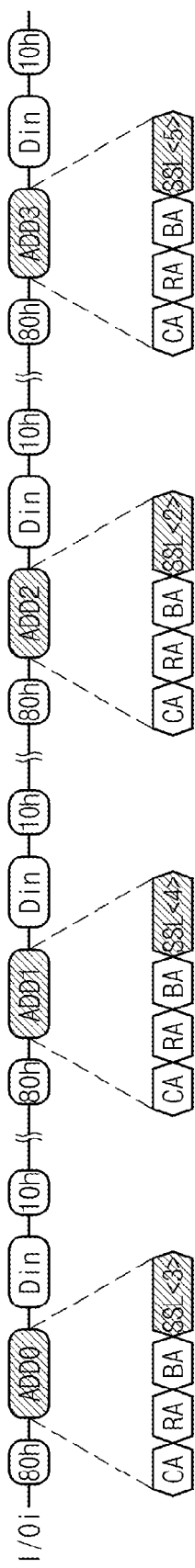

Referring to FIG. 10E, there may be illustrated a write command sequence corresponding to a first zigzag manner Zig1 in FIG. 8D. The memory controller 110 may provide string selection line addresses of a selected memory block according to a first zigzag manner Zig1 or a second zigzag manner Zig2 relative to an arrangement order of the string selection lines. Write command sequences with respect to respective columns or respective word lines (e.g., WL<0> to WL<7>) follow write command sequences corresponding to string selection lines.

An address ADD0 may include a string selection line address SSL<3>, an address ADD1 may include a string selection line address SSL<4>, an address ADD2 may include a string selection line address SSL<2>, and an address ADD3 may include a string selection line address SSL<5>. Then, although not shown in figures, an address ADD4 may include a string selection line address SSL<1>, an address ADD5 may include a string selection line address SSL<6>, an address ADD6 may include a string selection line address SSL<0>, and an address ADD7 may include a string selection line address SSL<7>.

Figure 10F:
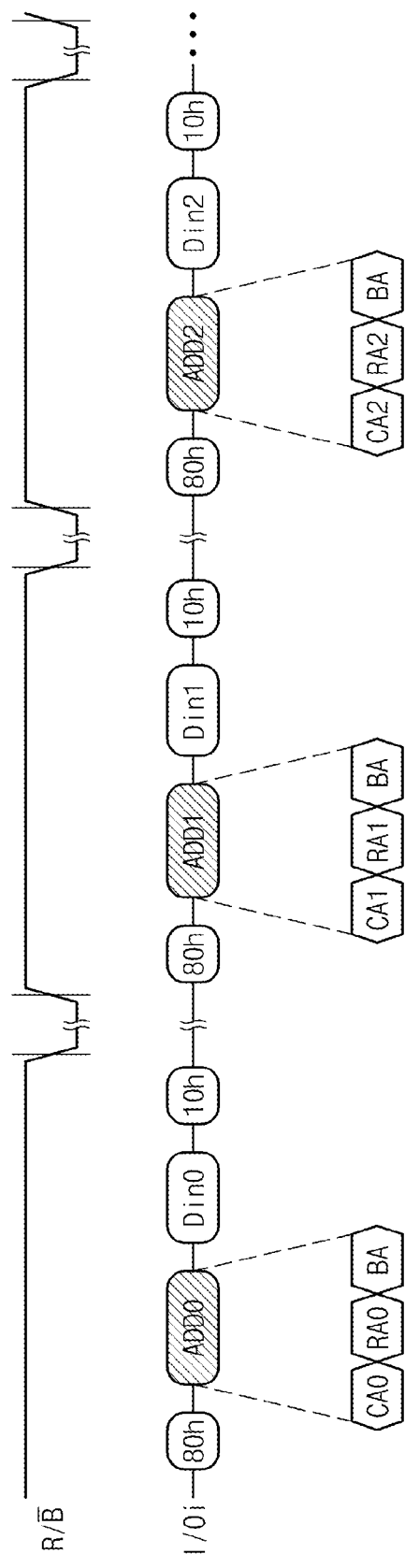

Referring to FIG. 10F, the memory controller 110 may provide the nonvolatile memory device 120 with string selection line addresses of a selected memory block in another sequence according to another embodiment of the inventive concept.

An address ADD may include a column address CA, a row address RA, a block address BA. A string selection line address SSL may be assigned to the column address CA, the row address RA, or the block address BA. The data transfer Din corresponding to the string selection line address SSL may be transferred after the address transfer. The memory controller 110 may provide the nonvolatile memory device 120 with a write command sequence. When a status signal R/B of the nonvolatile memory device 120 is at a ready state (e.g., at a high state), the memory controller 110 may provide a write command sequence of 80h-ADD0-Din0-10h with input/output terminals I/Oi of the nonvolatile memory device 120. The nonvolatile memory device 120 may switch a state of the status signal R/B into a busy state (e.g., a low state) in response to an input of '10h' indicating program confirm. The nonvolatile memory device 120 may program input data Din at a memory region corresponding to an address ADD0.

Referring to FIG. 10G, the memory controller 110 may provide the nonvolatile memory device 120 with string selection line addresses of a selected memory block in another sequence according to another embodiment of the inventive concept.

An address ADD may include a column address CA, a row address RA. A string selection line address SSL may be assigned to the column address CA or the row address RA. The data transfer Din corresponding to the string selection line address SSL may be transferred after the address transfer. The memory controller 110 may provide the nonvolatile memory device 120 with a write command 80h (page write command) or 85h (random write command). The random write command may only transfer a part of the addresses that are transferred according to the page write command. The remaining addresses, which are not transferred for random write compared to the page write may be assumed to be the same as those of the page write. In other words, the random write command may deliver the only address to determine the next string selection line address. When a status signal R/B of the nonvolatile memory device 120 is at a ready state (e.g., at a high state), the memory controller 110 may provide a write command sequence of 80h-ADD0-Din-10h with input/output terminals I/Oi of the nonvolatile memory device 120. The nonvolatile memory device 120 may switch a state of the status signal R/B into a busy state (e.g., a low state) in response to an input of '10h' indicating program confirm. The nonvolatile memory device 120 may program input data Din at a memory region corresponding to an address ADD. After programming Din0 at the address ADD0, the non-volatile memory device 120 may keep the row address RA0, RA1, RA2 the same, and the next command which is 85h (random write) may change only the column address, which is related to choose a string selection line address.

However, the address format of the random write (85h) can vary according to the architecture of the nonvolatile memory device 120. The random write command 985h) having ADD1 address may change the page data stored in a page buffer of the nonvolatile memory device 120. By sending a random write command, the memory controller 110 can change the string selection line address as well as the whole or part of the page data stored in the page buffer of the nonvolatile memory device 120.

Figure 10H:
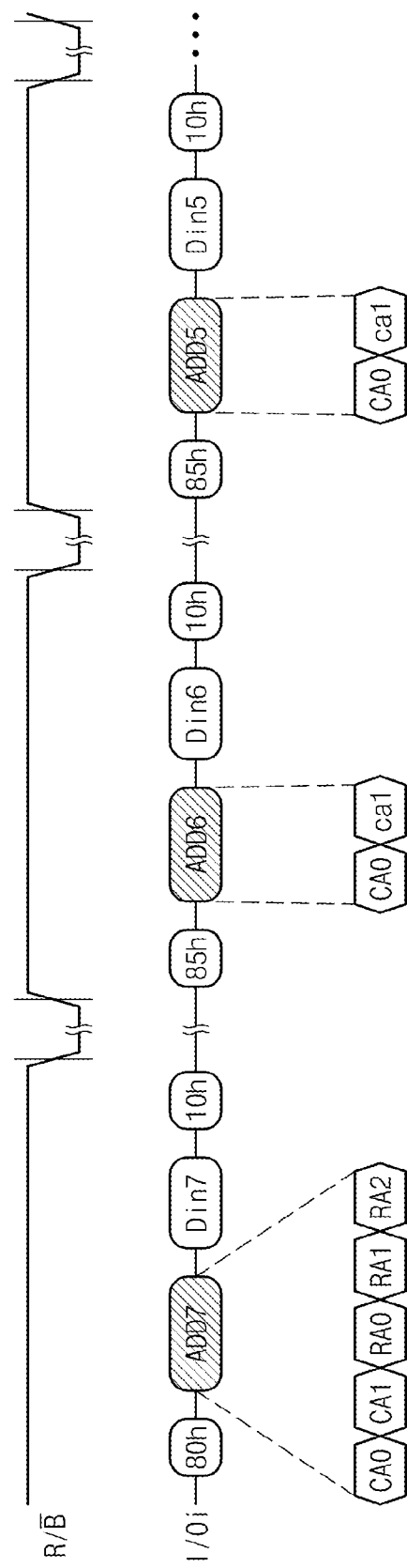

Referring to FIG. 10H, the memory controller 110 may provide the nonvolatile memory device 120 with 80h (page write command) and 10h (confirm command) before sending 85h (random write command) and 10h (confirm command). After programming Din0 at the address ADD0, the non-volatile memory device 120 may keep the row address RA0, RA1, RA2 the same, and the next command—85h (random write)—may change only the column address, which is related to determining a string selection line address. But, the address format of the random write (85h) can vary according to the architecture of the nonvolatile memory device 120.

The addresses and data, which are transferred from the nonvolatile memory controller 110, may be arranged according to the wear leveling information WLCNT of the blocks in the nonvolatile memory device 120 before they are transferred. For example, referring to FIG. 10H, the address ADD7 and its corresponding data Din7 may be transferred first and the address ADD6 and its corresponding data Din6 may follow according to the wear leveling information that determines the string selection line address sequences.

Referring to FIG. 1, there is described herein a technique of changing a selection sequence of string selection lines through address remapping of the memory controller 110. In this case, it is possible to apply a programming method of the inventive concept to other similar nonvolatile memory devices.

Figure 11:
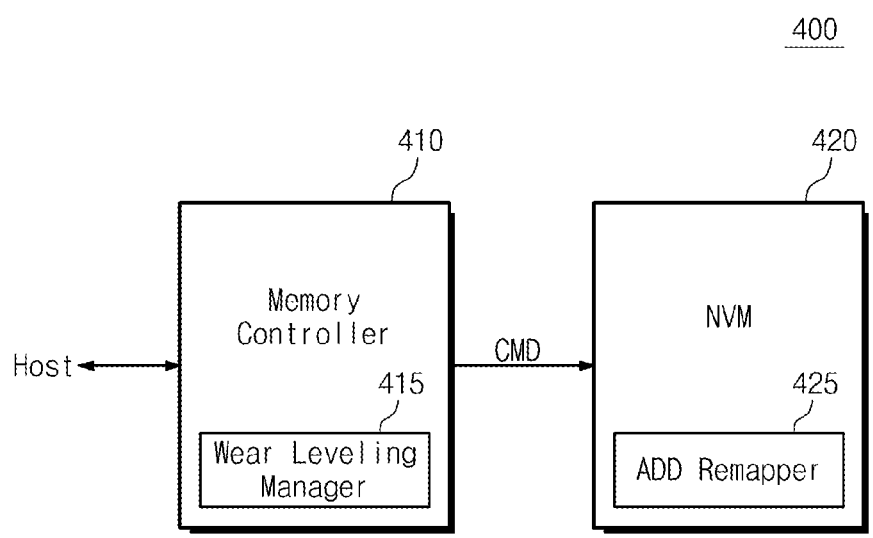
FIG. 11 is a block diagram schematically illustrating a memory system according to another embodiment of the inventive concept.

FIG. 11 is a block diagram schematically illustrating a memory system according to another embodiment of the inventive concept. Referring to FIG. 11, a memory system 400 may include a memory controller 410 and a nonvolatile memory device 420. Herein, the memory controller 410 may provide the nonvolatile memory device 420 with a specific write command CMD based on wear leveling information. For example, the memory controller 410 may provide the nonvolatile memory device 420 with a write command CMD including wear leveling information. For example, the write command CMD may be a SET_FEATURE command to configure the nonvolatile memory device 420. The configuration information such as wear leveling or change of selection line address sequence can be transferred immediately after the SET_FEATURE command, or shortly thereafter. The nonvolatile memory device 420 may reconfigure a string selection line address in response to the write command CMD and the wear leveling information.

The memory controller 410 may include a wear leveling manager 415, which is configured to manage wear leveling information of all memory blocks of the nonvolatile memory device 420. When a write operation is requested from an external device, the memory controller 410 may provide the nonvolatile memory device 420 with a write command CMD including wear leveling information WLCNT.

The nonvolatile memory device 420 may remap a string selection line address in response to a write command CMD including wear leveling information WLCNT. The nonvolatile memory device 420 may include an address remapper 425, which is configured to adjust string selection line addresses. The address remapper 425 may reestablish a selection sequence of string selection lines of a selected memory block, based on wear leveling information WLCNT included in a command. Through the address remapper 425, the nonvolatile memory device 420 may select string selection lines according to an arrangement order, the inverse of the arrangement order, or a zigzag sequence.

With the above description, the memory system 400 of the inventive concept may include the memory controller 410, which is configured to provide wear leveling information WLCNT with a write command. The nonvolatile memory device 420 may adjust a selection sequence of string selection lines in a selected memory block, based on the wear leveling information WLCNT provided with the write command.

Figure 12A:
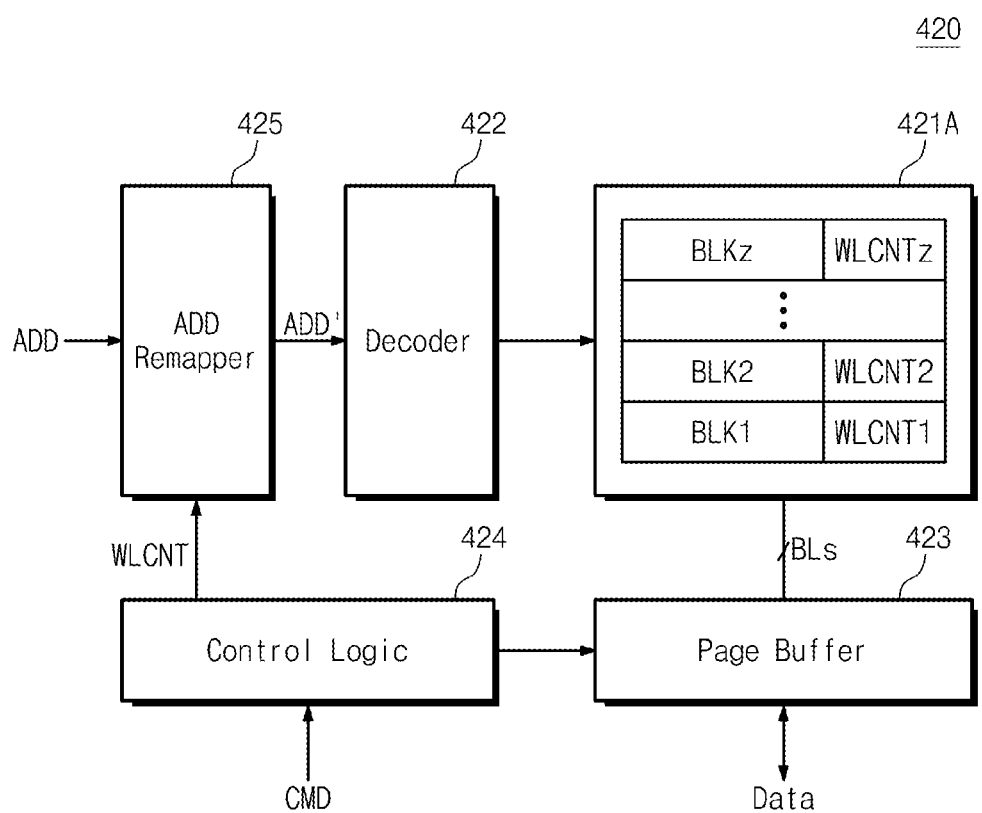
FIGS. 12A and 12B are block diagrams schematically illustrating a nonvolatile memory device according to another embodiment of the inventive concept.
Figure 12B:
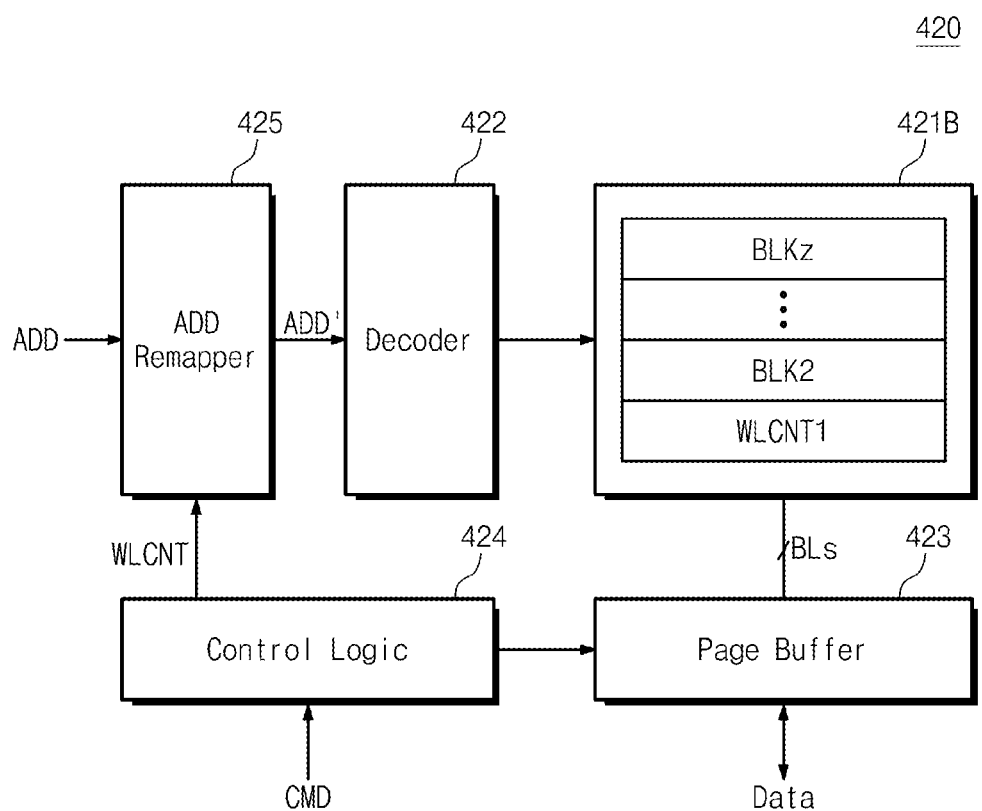

FIGS. 12A and 12B are block diagrams schematically illustrating a nonvolatile memory device 420 according to other embodiments of the inventive concepts. Referring to FIGS. 12A and 12B, a nonvolatile memory device 420 may include a memory cell array 421A or 421B, a decoder 422, a page buffer 423, control logic 424, and an address remapper 425. The constituent elements 421A or 421B to 423 may be configured the same as illustrated in FIG. 1, and description thereof is thus omitted.

The control logic 424 may control the page buffer 423 and the address remapper 425 in response to a command CMD transferred from an external device. The control logic 424 may provide the address remapper 425 with wear leveling information WLCNT included in the command CMD. The address remapper 425 may reconfigure a string selection line address of an input address ADD based on the wear leveling information WLCNT. An address ADD' reconfigured to adjust a sequence of string selection lines may be provided to the decoder 422. Through the address remapper 425, string selection lines of a selected memory block may be selected according to an arrangement order, the inverse of the arrangement order, or a zigzag sequence.

The nonvolatile memory device 420 may adjust a string selection line address based on wear leveling information WLCNT provided from a memory controller 410. A selection sequence of string selection lines may be switched when a wear leveling count (e.g., erase count) exceeds a reference value. It is possible to reduce a stress forced to a memory cell in a memory block by switching a selection sequence of string selection lines.

The wear leveling information WLCNT of the blocks in the nonvolatile memory device 420 may be stored in a dummy area in a page of the nonvolatile memory address that is not used to store user data. The wear leveling information may be stored in the dummy area by the memory controller during the programming of user data. The dummy area may be included in every page of the nonvolatile memory device 421A or a block of the nonvolatile memory device 421B. The wear leveling information may be stored in the nonvolatile memory device 420 before the power of the nonvolatile memory system 400 is turned off and read from the nonvolatile memory device 420 when the nonvolatile memory system 400 is turned on. When the wear leveling information is stored in the nonvolatile memory device 420, the important bits of the wear leveling count can be duplicated or encrypted for better reliability of the wear leveling count.

Figure 13:
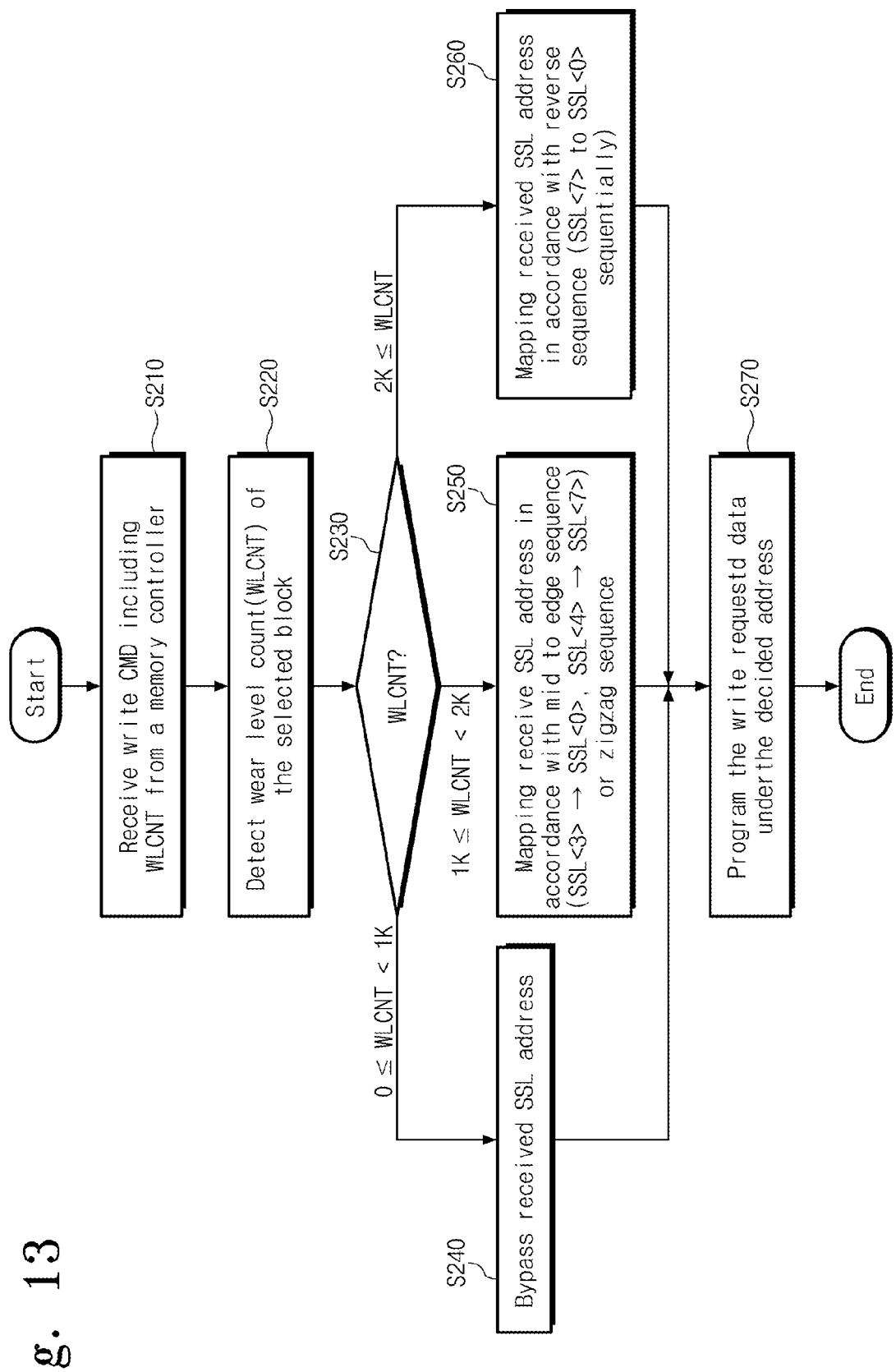
FIG. 13 is a flowchart schematically illustrating a programming method of a nonvolatile memory device in FIG. 12.

FIG. 13 is a flowchart schematically illustrating a programming method of a nonvolatile memory device in FIGS. 12A and 12B. Referring to FIG. 13, a nonvolatile memory device 420 may remap a string selection line address based on wear leveling information included in a command.

In operation S210, the nonvolatile memory device 420 may receive a write command CMD including wear leveling information WLCNT from a memory controller 410. The memory controller 410 may detect wear leveling information corresponding to a selected memory block to code it to be included in a write command. Control logic 424 may decode the write command to extract wear leveling information WLCNT. The control logic 424 may provide the wear leveling information WLCNT to an address remapper 425.

In operation S220, the address remapper 425 may acquire group information of the selected memory block from the wear leveling information WLCNT. The address remapper 425 may reconfigure an input address ADD to an adjusted address ADD' according to the group information.

In operation S230, the address remapper 425 may perform a divergence of operation for determining a selection sequence of string selection lines of the selected memory block according to the wear leveling information WLCNT. When a value of the wear leveling information WLCNT is larger than or equal to a reference value of 0 and smaller than a reference value of 1K (1024), the method proceeds to operation S240. When a value of the wear leveling information WLCNT is larger than or equal to the reference value of 1K (1024) and lower than a reference value of 2K (2048), the method proceeds to operation S250. When a value of the wear leveling information WLCNT is larger than or equal to a reference value of 2K (2048), the method proceeds to operation S260. Herein, memory blocks may be classified into three groups according to the wear leveling information WLCNT. However, the inventive concept is not limited thereto. For example, memory blocks may be classified into two groups or four or more groups according to the wear leveling information WLCNT.

In operation S240, the address remapper 425 may maintain a string selection line address, associated with a memory block having a value of wear leveling information WLCNT larger than or equal to 0 and smaller than 1K (1024), to have a default value. The address remapper 425 may establish a string selection line address such that string selection lines of a selected memory block are selected according to an arrangement order of SSL<0> to SSL<7> (e.g., an ascending sequence). In the event that a default value is set such that a selection sequence of string selection lines follows an arrangement order, the address remapper 425 may bypass a string selection line address corresponding to the default value.

In operation S250, the address remapper 425 may reconfigure a string selection line address associated with a memory block having a value of wear leveling information WLCNT larger than or equal to 1K and smaller than 2K. The address remapper 425 may establish a string selection line address such that string selection lines of a selected memory block are selected to be different an arrangement order of SSL<0> to SSL<7>. For example, the address remapper 425 may adjust a string selection line address such that string selection lines are selected according to one of sequences illustrated in FIGS. 8C and 8D.

In operation S260, the address remapper 425 may adjust a string selection line address, associated with a memory block having a value of wear leveling information WLCNT larger than or equal to 2K, such that string selection lines are selected in the inverse of an arrangement order (e.g., a descending sequence). For example, the address remapper 425 may adjust a string selection line address such that string selection lines of a selected memory block are selected in the inverse SSL<7> to SSL<0> of an arrangement order of SSL<0> to SSL<7>.

In operation S270, the control logic 424 may program data at a memory block corresponding to the adjusted address ADD'. That is, through the address remapper 425, there may be programmed memory cells of a memory block selected according to a string selection line address in light of the wear leveling information WLCNT.

With the above description, the memory controller 410 may provide the nonvolatile memory device 420 with wear leveling information WLCNT with a write command. The nonvolatile memory device 420 may reconfigure a string selection line address of a selected memory block based on the wear leveling information WLCNT.

FIG. 14 is a table describing an address adjusting operation of an address remapper of a nonvolatile memory device in FIGS. 12A and 12B. Referring to FIG. 14, an input string selection line address may be remapped in the same sequence or a changed sequence according to wear leveling information WLCNT.

In the event that a value of wear leveling information WLCNT of a selected memory block is larger than or equal to 0 and smaller than 1K (1024), an address remapper 425 may output an adjusted address ADD' being the same as an input value. That is, when an address of a string selection line of an input address ADD corresponds to SSL<3>, the address remapper 425 may output the same string selection line address SSL<3>.

If a value of wear leveling information WLCNT of a selected memory block is larger than or equal to 1K and smaller than 2K, the address remapper 425 may adjust an input address such that string selection lines are selected in a zigzag manner. For example, string selection line addresses SSL<0>, SSL<1>, SSL<2>, and SSL<3> may be mapped to string selection line addresses SSL<3>, SSL<4>, SSL<2>, and SSL<5>, respectively. Also, string selection line addresses SSL<4>, SSL<5>, SSL<6>, and SSL<7> may be mapped to string selection line addresses SSL<1>, SSL<6>, SSL<0>, and SSL<7>, respectively.

The address remapper 425 may adjust string selection line addresses so as to be selected in the inverse of an arrangement order when a value of wear leveling information WLCNT of a selected memory block is larger than or equal to 2K. For example, string selection line addresses SSL<0>, SSL<1>, SSL<2>, and SSL<3> may be mapped to string selection line addresses SSL<7>, SSL<6>, SSL<5>, and SSL<4>, respectively. Also, string selection line addresses SSL<4>, SSL<5>, SSL<6>, and SSL<7> may be mapped to string selection line addresses SSL<3>, SSL<2>, SSL<1>, and SSL<0>, respectively.

Figure 15:
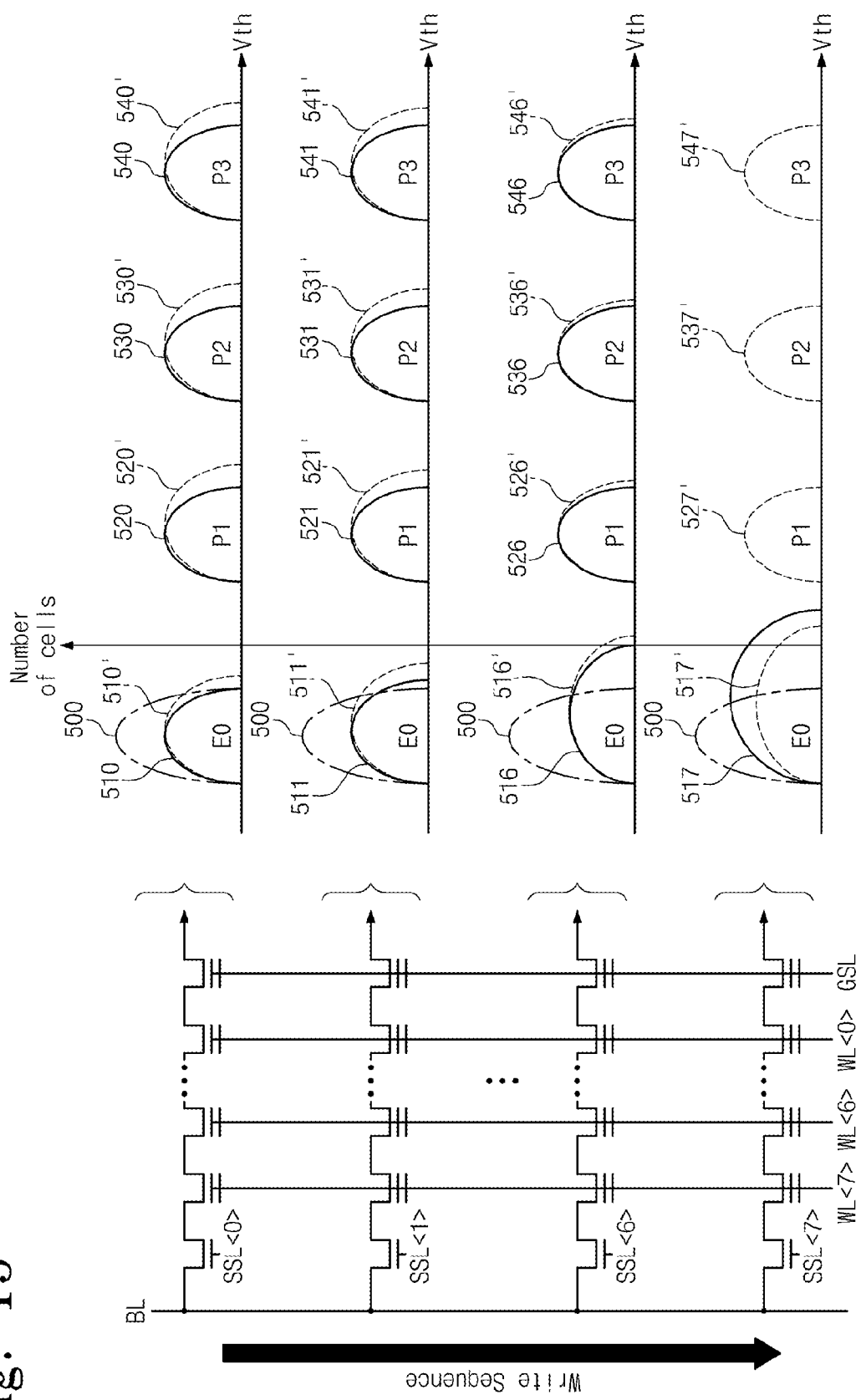
FIG. 15 is a diagram illustrating an effect of the inventive concept.

FIG. 15 is a diagram illustrating an effect of the inventive concept. Referring to FIG. 15, in a case where a selection sequence of string selection lines of a memory block is fixed, a threshold voltage distribution of memory cells formed according to a progress of programming is illustrated. Threshold voltage distributions of memory cells sharing each of string selection lines SSL<0> to SSL<7> are illustrated according to a progress of programming Before programming, all memory cells connected with a string selection line SSL<0> may be included in a threshold voltage distribution 500. When 2-bit data is programmed at selected memory cells, threshold voltage distributions 510, 520, 530, and 540 denoted by a solid line may be formed. Due to a word line stack structure, memory cells connected with the string selection line SSL<0> may be stressed until memory cells connected with string selection lines SSL<1> to SSL<7> are programmed. After programming on memory cells connected with the string selection line SSL<7> is completed, threshold voltage distributions 510', 520', 530', and 540' may be formed as illustrated by a dotted line.

Before programming, all memory cells connected with the string selection line SSL<1> may be included in a threshold voltage distribution 500. When a programming operation is completed, threshold voltage distributions 511, 521, 531, and 541 denoted by a solid line may be formed. Due to a word line stack structure, memory cells connected with the string selection line SSL<1> may be stressed until memory cells connected with string selection lines SSL<2> to SSL<7> are programmed. After programming on memory cells connected with the string selection line SSL<7> is completed, threshold voltage distributions 511', 521', 531', and 541' may be formed as illustrated by a dotted line.

Before programming, all memory cells connected with the string selection line SSL<6> may be included in a threshold voltage distribution 500. When a programming operation is completed, threshold voltage distributions 516, 526, 536, and 546 denoted by a solid line may be formed. Due to a word line stack structure, memory cells connected with the string selection line SSL<6> may be stressed until memory cells connected with string selection line SSL<7> are programmed. After programming on memory cells connected with the string selection line SSL<6> is completed, threshold voltage distributions 516', 526', 536', and 546' may be formed as illustrated by a dotted line. Herein, memory cells, having an erase state, from among memory cells connected with the string selection line SSL<6> may be stressed from a point of time when memory cells connected with the string selection line SSL<0> are programmed. For this reason, a distribution 516' corresponding to an erase state E0 may be excessively widened. In this case, a stress may be excessively forced to memory cells, thus accelerating deterioration of an oxide film.

In particular, all memory cells connected with the string selection line SSL<7> may be included in a threshold voltage distribution 500 before programming A threshold voltage distribution may be formed as illustrated by a dotted line 517' before memory cells connected with the string selection line SSL<7> are programmed. With the threshold voltage distribution 517, there may exist memory cells, each having a threshold voltage distribution higher than 0V due to an iterated stress, from among memory cells corresponding to an erase state E0. After programming on memory cells connected with the string selection line SSL<7> is completed, threshold voltage distributions 517', 527', 537', and 547' may be formed as illustrated by a dotted line.

Herein, the threshold voltage distribution 517' of memory cells corresponding to an erase state E0 may cause an error at a data read operation. Since memory cells connected with the string selection line SSL<7> are iteratively stressed, an oxide film of a memory cell may be deteriorated relatively rapidly.

The above-described problem may be solved by changing a selection sequence of string selection lines using wear leveling information. With the inventive concept, deterioration of memory cells in a memory block may be equalized. Although an erase count increases, deterioration of memory cells in a memory block due to a voltage stress become more uniform. Thus, it is possible to improve the reliability of memory cells compared with the case that a voltage stress is focused.

Figure 16:
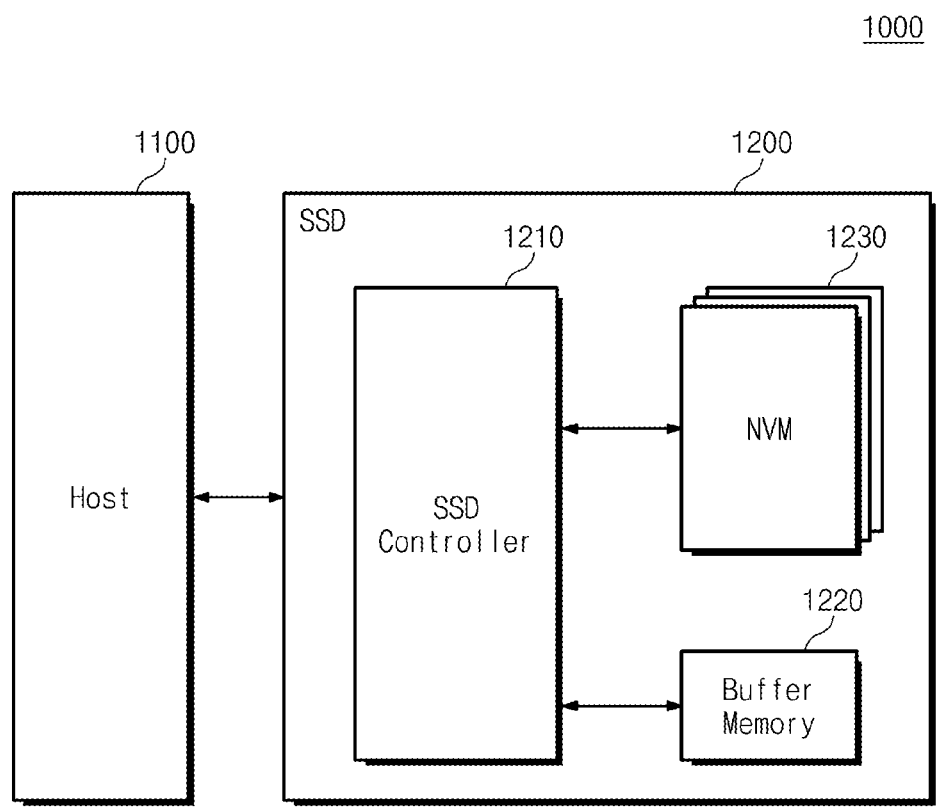
FIG. 16 is a block diagram illustrating a user device including a solid state drive according to an embodiment of the inventive concept.

FIG. 16 is a block diagram illustrating a user device including a solid state drive according to an embodiment of the inventive concept. Referring to FIG. 16, a user device 1000 may include a host 1100 and a solid state drive (hereinafter, referred to as SSD) 1200. The SSD 1200 may include an SSD controller 1210, a buffer memory 1220, and a nonvolatile memory device 1230.

The SSD controller 1210 may provide physical interconnection between the host 1100 and the SSD 1200. The SSD controller 1210 may provide an interface with the SSD 1200 corresponding to a bus format of the host 1100. In particular, the SSD controller 1210 may decode a command provided from the host 1100. The SSD controller 1210 may access the nonvolatile memory device 1230 according to the decoding result. The bus format of the host 1100 may include USB (Universal Serial Bus), SCSI (Small Computer System Interface), PCI express, ATA, PATA (Parallel ATA), SATA (Serial ATA), SAS (Serial Attached SCSI), and the like.

The buffer memory 1220 may temporarily store write data provided from the host 1100 or data read out from the nonvolatile memory device 1230. In the event that data existing in the nonvolatile memory device 1230 is cached at a read request of the host 1100, the buffer memory 1220 may support a cache function of providing cached data directly to the host 1100. Typically, a data transfer speed of a bus format (e.g., SATA or SAS) of the host 1100 may be higher than that of a memory channel of the SSD 1200. That is, in the event that an interface speed of the host 1100 is remarkably fast, lowering of the performance due to a speed difference may be minimized by providing the buffer memory 1220 having a large storage capacity.

The buffer memory 1220 may be formed of a synchronous DRAM to provide sufficient buffering to the SSD 1200 used as an auxiliary mass storage device. However, the buffer memory 1220 is not limited to this disclosure.

The nonvolatile memory device 1230 may be provided as a storage medium of the SSD 1200. For example, the nonvolatile memory device 1230 may be formed of a vertical NAND flash memory device having a mass storage capacity. The nonvolatile memory device 1230 may be formed of a plurality of memory devices. In this case, memory devices may be connected to the SSD controller 1210 by a channel unit. As a storage medium, the nonvolatile memory device 1230 may be formed of a NAND flash memory. However, the nonvolatile memory device 1230 is not limited to a NAND flash memory device. For example, a storage medium of the SSD 1200 can be formed of a PRAM, an MRAM, a ReRAM, a FRAM, a NOR flash memory, and the like. Further, the inventive concept may be applied to a memory system which uses different types of memory devices together. The nonvolatile memory device 1230 may be configured substantially the same as described in FIG. 1.

The SSD controller 1210 may adjust a selection sequence of string selection lines of the nonvolatile memory device 1230, based on wear leveling information. With this manner, it is possible to extend the life of the SSD 1200 and improve the reliability of data.

Figure 17:
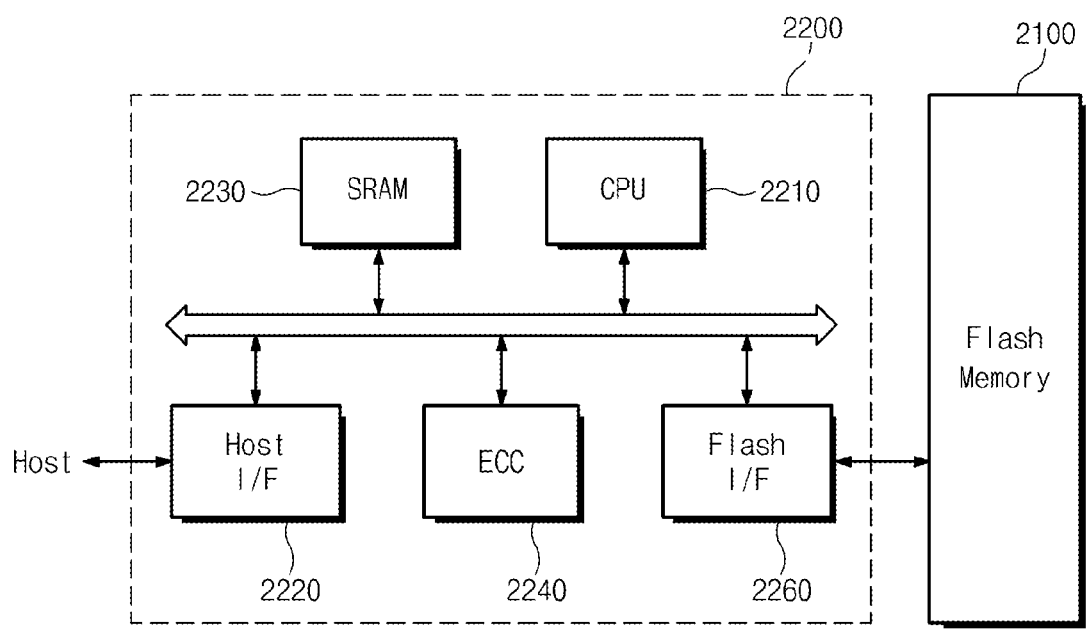
FIG. 17 is a block diagram illustrating a memory system according to another embodiment of the inventive concept.

FIG. 17 is a block diagram illustrating a memory system according to another embodiment of the inventive concept. Referring to FIG. 17, a memory system 2000 may include a nonvolatile memory 2100 and a memory controller 2200.

The nonvolatile memory 2100 may be configured substantially the same as described in FIG. 1 or 11, and description thereof is thus omitted.

The memory controller 2200 may be configured to control the nonvolatile memory 2100. An SRAM 2230 may be used as a working memory of a CPU 2210. A host interface 2220 may include a data exchange protocol of a host connected with the memory system 2000. An ECC block 2240 may be configured to detect and correct errors included in data read out from the nonvolatile memory 2100. A memory interface 2260 may interface with the nonvolatile memory 2100 according to an embodiment of the inventive concept. The CPU 2210 may execute an overall control operation for data exchange of the memory controller 2200. Although not shown in FIG. 17, the memory system 2000 may further include ROM which stores code data for interfacing with the host.

The memory controller 2200 may communicate with an external device (e.g., host) via one of interface protocols such as USB, MMC, PCI-E, SAS, SATA, PATA, SCSI, ESDI, IDE, and the like.

The memory controller 2200 may adjust a selection sequence of string selection lines of the nonvolatile memory device 2100, based on wear leveling information. With this manner, it is possible to extend the life of the memory system 2000 and improve the reliability of data.

In example embodiments, the memory system 2000 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

Figure 18:
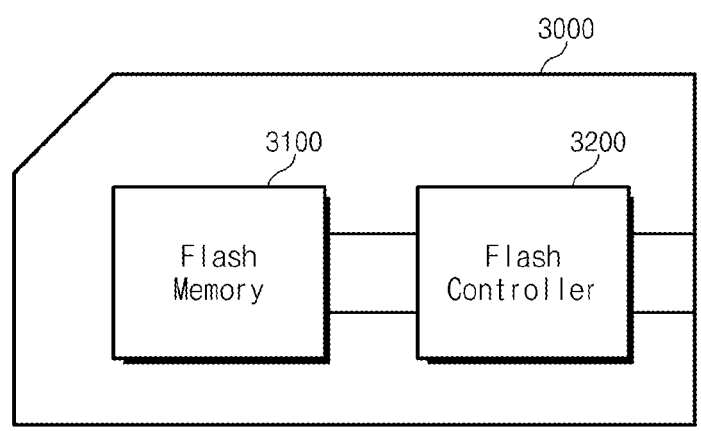
FIG. 18 is a block diagram illustrating a data storage device according to still another embodiment of the inventive concept.

FIG. 18 is a block diagram illustrating a data storage device according to still another embodiment of the inventive concept. Referring to FIG. 18, a data storage device 3000 may include a flash memory 3100 and a flash controller 3200. The flash controller 3200 may control the flash memory 3100 in response to control signals input from the outside of the data storage device 3000.

The flash memory 3100 may be configured substantially the same as described with reference to FIG. 1 or 11. The flash controller 3200 may adjust a selection order of string selection lines of the flash memory 3100 based on wear leveling information. With this manner, it is possible to extend the life of the memory system 2000 and improve the reliability of data.

The data storage device 3000 may be a memory card device, an SSD device, a multimedia card device, an SD device, a memory stick device, a HDD device, a hybrid drive device, or an USB flash device. For example, the data storage device 3000 may be a card, which satisfies a standard for using a user device such as a digital camera, a personal computer, and the like.

Figure 19:
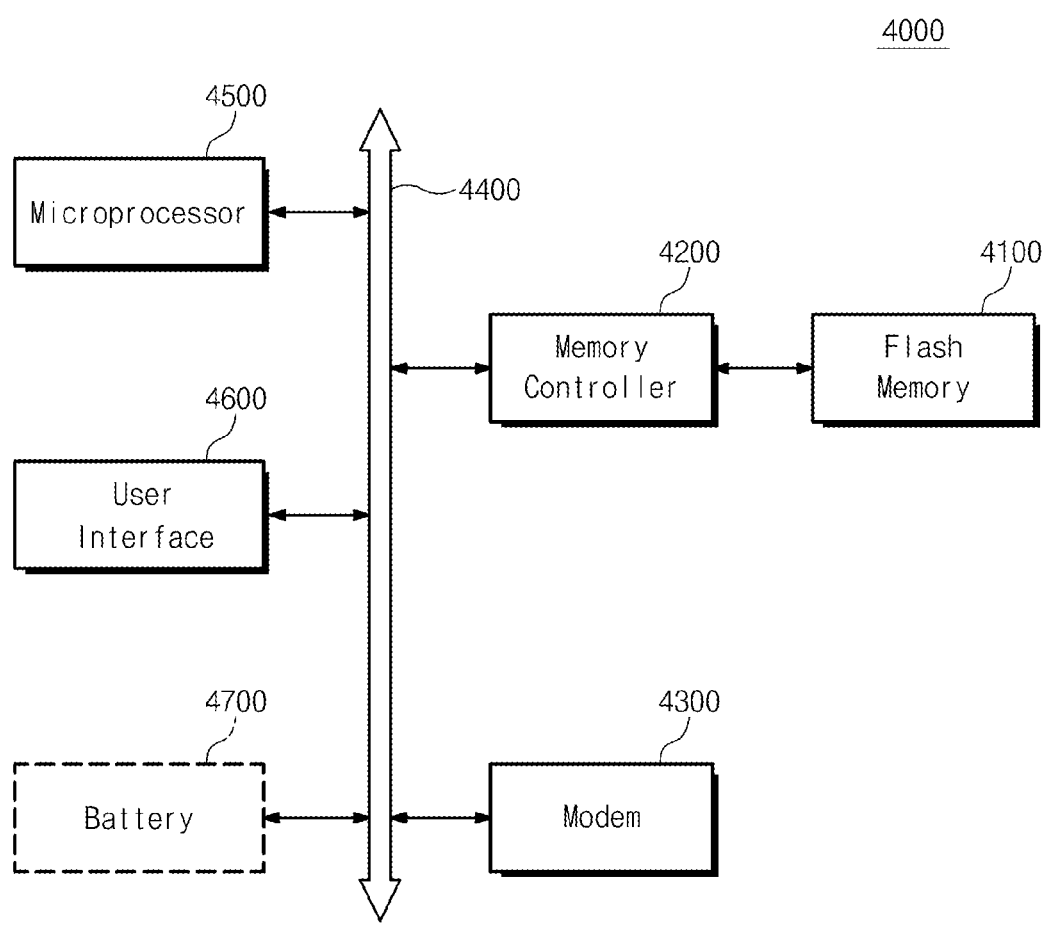
FIG. 19 is a block diagram illustrating a computing system including a flash memory device according to an embodiment of the inventive concept.

FIG. 19 is a block diagram illustrating a computing system including a flash memory device according to an embodiment of the inventive concept. Referring to FIG. 19, a computing system 4000 may include a flash memory device 4100, a memory controller 4200, a modem 4300 such as a baseband chipset, a microprocessor 4500, and a user interface 4600. The elements 4200, 4300, 4500, and 4600 may be electrically connected to a bus 4400.

The flash memory device 4100 and the memory controller 4200 may be configured substantially the same as described with reference to FIG. 1 or 11. The memory controller 4200 may adjust a selection sequence of string selection lines of the flash memory device 4100, based on wear leveling information. With this manner, it is possible to extend the life of the computing system 4000 and improve the reliability of data.

If the computing system 4000 is a mobile device, it may further include a battery 4700, which powers the computing system 4000. Although not shown in FIG. 19, the computing system 4000 may further include an application chipset, a camera image processor (CIS), a mobile DRAM, and the like. The memory controller 4200 and the flash memory device 4100 may constitute a solid state drive/disk (SSD), which uses a nonvolatile memory to store data.

A nonvolatile memory device or a memory controller may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method for programming a nonvolatile memory device, the nonvolatile memory device including cell strings formed in a direction perpendicular to a substrate, the method comprising:
   detecting wear leveling information of a selected memory block;
   determining a selection sequence of string selection lines of the selected memory block according to the wear leveling information; and
   writing data at the selected memory block according to the determined selection sequence.

2. The method of claim 1, further comprising changing the selection sequence of the string selection lines when a value of the wear leveling information exceeds a reference value.

3. The method of claim 2, wherein the selection sequence includes a first sequence in which the string selection lines are selected according to an arrangement order of the string selection lines, a second sequence in which the string selection lines are selected in the inverse of the arrangement order of the string selection lines, and a third sequence in which the string selection lines are selected toward an edge from a center.

4. The method of claim 1, wherein the wear leveling information includes an erase count of the selected memory block.

5. A memory system, comprising:
a nonvolatile memory device including a memory block connected with a plurality of string selection lines; and
a memory controller configured to control the nonvolatile memory device to select at least one of the plurality of string selection lines,
wherein the memory controller is configured to change a selection sequence of the plurality of string selection lines according to wear leveling information of the memory block.

6. The memory system of claim 5, wherein the memory controller is configured to provide the nonvolatile memory device with a string selection line address corresponding to the selection sequence.

7. The memory system of claim 6, wherein when a value of the wear leveling information exceeds a reference value, the memory controller is configured to provide the string selection line address so as to be selected regardless of an arrangement order of the plurality of string selection lines.

8. The memory system of claim 6, wherein when a value of the wear leveling information exceeds a reference value, the memory controller is configured to provide the string selection line address so as to be selected in the inverse of an arrangement order of the plurality of string selection lines.

9. The memory system of claim 6, wherein when a value of the wear leveling information is below a reference value, the memory controller is configured to provide the string selection line address so as to be sequentially selected according to an arrangement order of the plurality of string selection lines.

10. The memory system of claim 6, wherein the memory controller comprises:
a wear leveling manager configured to provide the wear leveling information of the memory block; and
an address remapper configured to adjust the string selection line address according to the wear leveling information.

11. The memory system of claim 5, wherein the memory controller is configured to provide the nonvolatile memory device with a write command including the wear leveling information.

12. The memory system of claim 11, wherein the nonvolatile memory device is configured to remap the string selection line address based on the write command.

13. The memory system of claim 11, wherein the write command is configured to change according to the wear leveling information.

14. The memory system of claim 11, wherein the memory block includes a plurality of cell strings formed in a vertical direction.

15. A nonvolatile memory device, comprising:
a cell array including a plurality of memory blocks each connected with a plurality of string selection lines;
a page buffer connected with bit lines of the cell array;
a decoder connected with the cell array via the plurality of string selection lines; and
an address remapper configured to remap an input address according to wear leveling information and to provide the remapped address to the decoder,
wherein the address remapper is configured to remap the input address such that a selection sequence of the plurality of string selection lines of a selected memory block is adjusted according to the wear leveling information.

16. A method of programming a nonvolatile memory device having a plurality of strings of memory cells, the method comprising:
generating a first address to write data to a memory block of the nonvolatile memory device;
detecting wear leveling information of the memory block corresponding to the first address;
generating a second address to adjust a selection sequence of string selection lines of the memory block according to the wear leveling information; and
writing the data at the second address of the memory block.

17. The method of claim 16, further comprising receiving a logical address from a host to write the data.

18. The method of claim 17, further comprising mapping the logical address to the first address by a flash translation layer (FTL).

19. The method of claim 16, further comprising mapping the first address to a second address by a remapper.

20. The method of claim 16, further comprising increasing a count value in the wear leveling information when the selected memory block is erased.

21. The method of claim 16, further comprising changing the selection sequence of the string selection lines when a value of the wear leveling information exceeds a reference value.

22. The method of claim 16, wherein the selection sequence includes a sequence in which the string selection lines are selected in the inverse of an arrangement order of the string selection lines.

23. The method of claim 16, wherein the selection sequence includes a sequence in which the string selection lines are selected toward an edge from a center.

24. The method of claim 16, wherein the selection sequence includes a sequence in which the string selection lines are selected in a zigzag manner relative to an arrangement order of the string selection lines.

25. The method of claim 16, further comprising transferring the second address to the nonvolatile memory device using a page write command.

26. The method of claim 16, further comprising transferring the second address to the nonvolatile memory device using a random write command.

27. The method of claim 16, wherein generating the second address comprises:
comparing a count value of the wear leveling information with a reference value;
determining a selection sequence of the string selection lines of the memory block based at least in part on a result of the comparison; and
generating the second address based at least in part on the determination of the selection sequence.

28. The method of claim 27, wherein generating the second address further comprises:
calculating a column address portion in the second address to adjust the string selection line sequence; and
generating the second address including the column address portion.

29. The method of claim 27, wherein generating the second address further comprises:
calculating a row address portion in the second address to adjust the string selection line sequence; and
generating the second address including the row address portion.

30. A memory system, comprising:
a nonvolatile memory device including a memory block connected with a plurality of string selection lines;
a memory controller configured to control the nonvolatile memory device to select at least one of the plurality of string selection lines; and
an address mapper configured to determine a selection sequence of the plurality of string selection lines according to wear leveling information of the memory block.

* * * * *